US012796327B2

(12) United States Patent
Maeda et al.

(10) Patent No.: US 12,796,327 B2
(45) Date of Patent: Nov. 10, 2026

(54) THERMOELECTRIC CONVERSION MODULE AND MANUFACTURING METHOD THEREFOR

(71) Applicant: Denka Company Limited, Tokyo (JP)

(72) Inventors: Ryota Maeda, Tokyo (JP); Takeshi Asami, Tokyo (JP); Ryota Niwa, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 174 days.

(21) Appl. No.: 18/843,784

(22) PCT Filed: Mar. 2, 2023

(86) PCT No.: PCT/JP2023/007859
§ 371 (c)(1),
(2) Date: Sep. 4, 2024

(87) PCT Pub. No.: WO2023/171532
PCT Pub. Date: Sep. 14, 2023

(65) Prior Publication Data

US 2026/0247863 A1 Aug. 20, 2026

(30) Foreign Application Priority Data

Mar. 8, 2022 (JP) ................................ 2022-035444

(51) Int. Cl.
*H10N 10/856* (2023.01)
*H10N 10/01* (2023.01)
*H10N 10/17* (2023.01)

(52) U.S. Cl.
CPC ........... *H10N 10/856* (2023.02); *H10N 10/01* (2023.02); *H10N 10/17* (2023.02)

(58) Field of Classification Search
CPC ....... H10N 10/856; H10N 10/01; H10N 10/17
See application file for complete search history.

(56) References Cited

U.S. PATENT DOCUMENTS

2014/0230871 A1 8/2014 Nishio et al.
2014/0251407 A1 9/2014 Nishio et al.
(Continued)

FOREIGN PATENT DOCUMENTS

JP 2002-198574 A 7/2002
JP 4895293 B2 3/2012
(Continued)

OTHER PUBLICATIONS

International Preliminary Report on Patentability and English translation of the Written Opinion of the International Searching Authority for International Application No. PCT/JP2023/007859, dated Sep. 19, 2024.

*Primary Examiner* — Angelo Trivisonno
(74) *Attorney, Agent, or Firm* — Birch, Stewart, Kolasch & Birch, LLP

(57) ABSTRACT

The thermoelectric conversion module includes a substrate having a first main face and a second main face, a thermoelectric conversion part located on the first main face, and a first thermal conduction part and a second thermal conduction part located on the second main face. The thermoelectric conversion part has a p-type thermoelectric conversion element and an n-type thermoelectric conversion element arranged along a first direction, each thickness of the n-type thermoelectric conversion element and the p-type thermoelectric conversion element is 3 μm or more and 30 μm or less, each of the p-type thermoelectric conversion element and the n-type thermoelectric conversion element includes a carbon nanotube and a conductive resin, and a mass percentage of the carbon nanotubes in the total mass of the thermoelectric conversion part is 30% or more and 70% or less.

10 Claims, 8 Drawing Sheets

(56) References Cited

U.S. PATENT DOCUMENTS

| | | | | |
|---|---|---|---|---|
| 2016/0005948 | A1 | 1/2016 | Hayashi et al. | |
| 2017/0179362 | A1* | 6/2017 | Nagata .................. | B82Y 30/00 |
| 2017/0197836 | A1 | 7/2017 | Nonoguchi et al. | |
| 2020/0006614 | A1 | 1/2020 | Shibata et al. | |
| 2020/0028055 | A1 | 1/2020 | Shibata et al. | |
| 2022/0293843 | A1 | 9/2022 | Asami et al. | |
| 2022/0302365 | A1 | 9/2022 | Asami et al. | |
| 2023/0200242 | A1 | 6/2023 | Sakurai: et al. | |

FOREIGN PATENT DOCUMENTS

| | | | | |
|---|---|---|---|---|
| JP | 2014-197647 | A | 10/2014 | |
| JP | 2015-115447 | A | 6/2015 | |
| JP | 2015-144212 | A | 8/2015 | |
| JP | 2016-157942 | A | 9/2016 | |
| JP | 2019-176052 | A | 10/2019 | |
| WO | WO 2013/047730 | A1 | 4/2013 | |
| WO | WO 2013/065631 | A1 | 5/2013 | |
| WO | WO 2015/198980 | A1 | 12/2015 | |
| WO | WO 2018/142748 | A1 | 8/2018 | |
| WO | WO 2018/158979 | A1 | 9/2018 | |
| WO | WO 2018/158980 | A1 | 9/2018 | |
| WO | WO 2021/025059 | A1 | 2/2021 | |
| WO | WO-2021025060 | A1 * | 2/2021 | ............ H10N 10/85 |
| WO | WO 2021/235526 | A1 | 11/2021 | |

* cited by examiner (a)

(b)

(a)

(b)

(a)

(b)

THERMOELECTRIC CONVERSION MODULE AND MANUFACTURING METHOD THEREFOR

TECHNICAL FIELD

The present disclosure relates to a thermoelectric conversion module and a method for manufacturing the same.

BACKGROUND ART

A thermoelectric conversion element may be used to perform power generation using geothermal heat, exhaust heat of a factory, or the like. Patent Document 1 discloses an embodiment in which a flexible substrate having a pattern layer composed of resin layers and metal layers is provided on both surfaces of a thermoelectric conversion module having a P-type thermoelectric element material and an N-type thermoelectric element material. In Patent Document 1, a metal layer included in one flexible substrate overlaps one electrode included in the thermoelectric conversion module, and a metal layer included in the other flexible substrate overlaps the other electrode included in the thermoelectric conversion module. In the above embodiment, by setting one flexible substrate to a high temperature state and setting the other flexible substrate to a low temperature state, a temperature difference is generated in a planar direction of the thermoelectric conversion module. Accordingly, an electromotive force is generated in the thermoelectric conversion module.

CITATION LIST

Patent Literature

[Patent Document 1] Japanese Patent No. 4,895,293

SUMMARY OF INVENTION

Technical Problem

In order to improve output of the thermoelectric conversion module as described in Patent Document 1, for example, it is conceivable to increase thermoelectric conversion efficiency by increasing the temperature difference. In order to increase the temperature difference in Patent Document 1, for example, the P-type thermoelectric element material and the N-type thermoelectric element material may be thinned. In this case, the thinner the thickness of each thermoelectric element material is, the higher the electrical resistance of each thermoelectric element material is, and the thermoelectric conversion efficiency may rather deteriorate. For this reason, a method capable of reliably improving output of the thermoelectric conversion module per unit area is desired.

An object of one aspect of the present disclosure is to provide a thermoelectric conversion module capable of improving output per unit area and a method for manufacturing the same.

Solution to Problem

A thermoelectric conversion module and a method for manufacturing the same according to one aspect of the present disclosure are as follows.

[1] A thermoelectric conversion module includes a substrate having a first main face and a second main face located opposite the first main face, a thermoelectric conversion part located on the first main face, and a first thermal conduction part and a second thermal conduction part located on the second main face and adjacent to each other along a first direction orthogonal to a thickness direction of the substrate, wherein the thermoelectric conversion part has a p-type thermoelectric conversion element and an n-type thermoelectric conversion element arranged along the first direction, a first end part of the p-type thermoelectric conversion element in the first direction is in contact with a first end part of the n-type thermoelectric conversion element in the first direction, in the thickness direction, the first thermal conduction part is overlapped with a second end part of the p-type thermoelectric conversion element in the first direction, in the thickness direction, the second thermal conduction part is overlapped with a second end part of the n-type thermoelectric conversion element in the first direction, each thickness of the p-type thermoelectric conversion element and the n-type thermoelectric conversion element is 3 μm or more and 30 μm or less, an interval between the first thermal conduction part and the second thermal conduction part in the first direction is greater than a length of the p-type thermoelectric conversion element in the first direction and a length of the n-type thermoelectric conversion element in the first direction, each of the p-type thermoelectric conversion element and the n-type thermoelectric conversion element includes a carbon nanotube and a conductive resin, and a mass percentage of the carbon nanotubes in the total mass of the thermoelectric conversion part is 30% or more and 70% or less.

[2] The thermoelectric conversion module according to [1], wherein a mass percentage of the carbon nanotubes in the total mass of the thermoelectric conversion part is 40% or more and 60% or less.

[3] The thermoelectric conversion module according to [1] or [2], wherein a mass percentage of the carbon nanotubes in the total mass of the p-type thermoelectric conversion element is 30% or more and 70% or less, and a mass percentage of the carbon nanotubes in the total mass of the n-type thermoelectric conversion element is 30% or more and 70% or less.

[4] The thermoelectric conversion module according to any one of [1] to [3], wherein the interval between the first thermal conduction part and the second thermal conduction part in the first direction is 3 mm or more and 15 mm or less.

[5] The thermoelectric conversion module according to any one of [1] to [4], wherein each thickness of the p-type thermoelectric conversion element and the n-type thermoelectric conversion element is 5 μm or more and 25 μm or less, and the interval between the first thermal conduction part and the second thermal conduction part in the first direction is 3 mm or more and less than 12 mm.

[6] The thermoelectric conversion module according to any one of [1] to [5], further includes a first thermoelectric conversion group located on the first main face and having the thermoelectric conversion part, and a second thermoelectric conversion group located on the first main face and located adjacent to the first thermoelectric conversion group along a second direction orthogonal to the thickness direction and the first direction, wherein the second thermoelectric conversion group has a second thermoelectric conversion part located adjacent to the thermoelectric conversion part along the second direction, the second thermoelectric conversion part has a second p-type thermoelectric conversion element and a second n-type thermoelectric conversion element arranged along the first direction, a first end part of the second p-type thermoelectric conversion element in the first direction is in contact with a first end part of the second n-type thermoelectric conversion element in the first direction, the first thermal conduction part and the second thermal conduction part each extend along the second direction, in the thickness direction, the first thermal conduction part is overlapped with a second end part of the second n-type thermoelectric conversion element included in the second thermoelectric conversion part in the first direction, and in the thickness direction, the second thermal conduction part is overlapped with a second end part of the second p-type thermoelectric conversion element included in the second thermoelectric conversion part in the first direction.

[7] The thermoelectric conversion module according to [6], further includes a first conductive part located on the first main face and connected to one end of the first thermoelectric conversion group in the first direction, and a second conductive part located on the first main face and connected to the other end of the first thermoelectric conversion group in the first direction and to one end of the second thermoelectric conversion group in the first direction, wherein each conductivity type of the first conductive part and the second conductive part is identical. [8] The thermoelectric conversion module according to any one of [1] to [7], wherein each width along the first direction of the first thermal conduction part and the second thermal conduction part is 0.5 mm or more and 2.0 mm or less.

[9] The thermoelectric conversion module according to any one of [1] to [8], wherein each of the substrate, the first thermoelectric conversion part, the second thermoelectric conversion part, the first thermal conduction part and the second thermal conduction part has a flexibility.

A method for manufacturing a thermoelectric conversion module according to any one of [1] to [9], including a first step of forming a mask on the first main face of the substrate, a second step of forming a first layer including a p-type thermoelectric conversion material on the first main face, a third step of forming a thermoelectric conversion layer extending along the first direction by immersing the substrate in an organic solvent after removing the mask, a fourth step of forming a plurality of thermal conduction parts on the second main face of the substrate after the third step, and a fifth step of forming an n-type thermoelectric conversion element in a part of the thermoelectric conversion layer by dripping a dopant solution on the part after the fourth step.

Advantageous Effects of Invention

According to one aspect of the present disclosure, a thermoelectric conversion module capable of improving output per unit area and a method for manufacturing the same may be provided.

DESCRIPTION OF EMBODIMENTS

Figure 1:
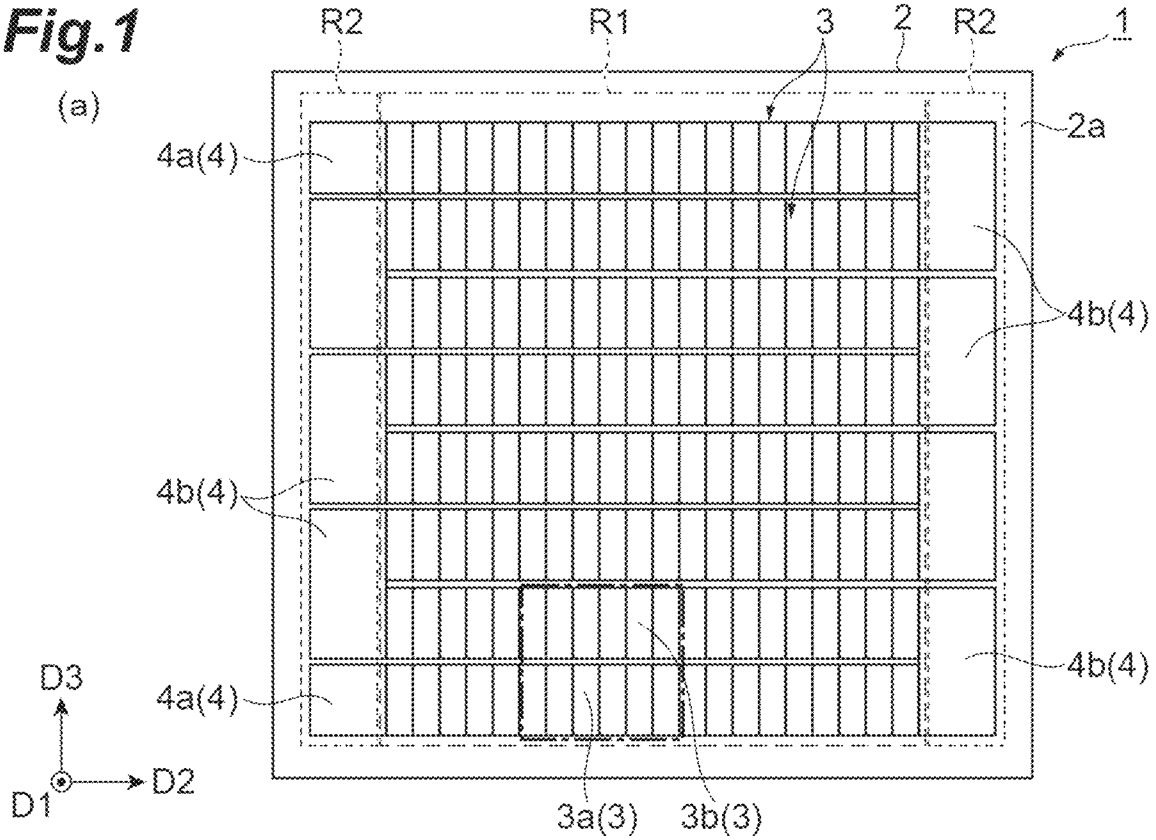
FIG. 1 (*a*) of FIG. 1 is a schematic plan view illustrating a thermoelectric conversion module according to an embodiment, and (b) of FIG. 1 is a schematic bottom view illustrating the thermoelectric conversion module according to an embodiment.
Figure 1:
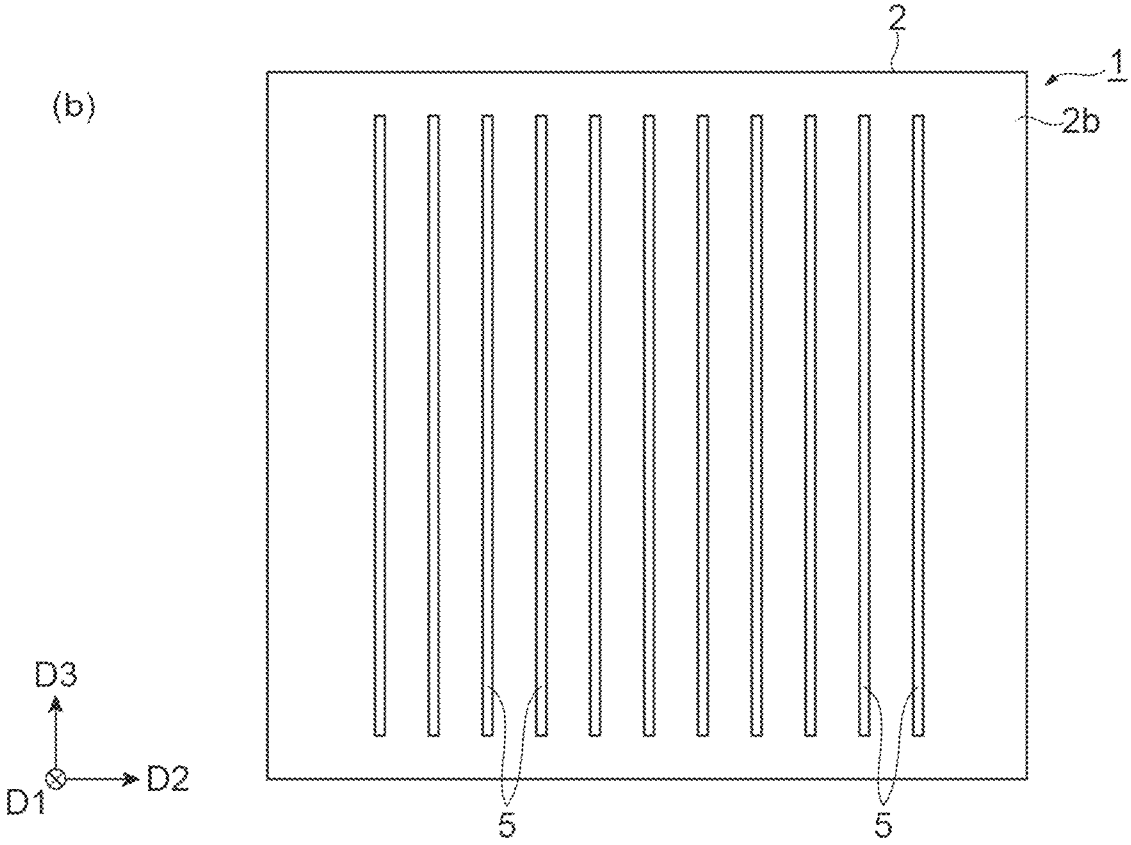

Hereinafter, an embodiment of the present disclosure will be described in detail with reference to the accompanying drawings. In the following description, the same reference numerals are used for the same element or element having the same function, and redundant description is omitted. In the present specification, "identical" and words similar thereto are not limited to "completely identical".

Figure 2:
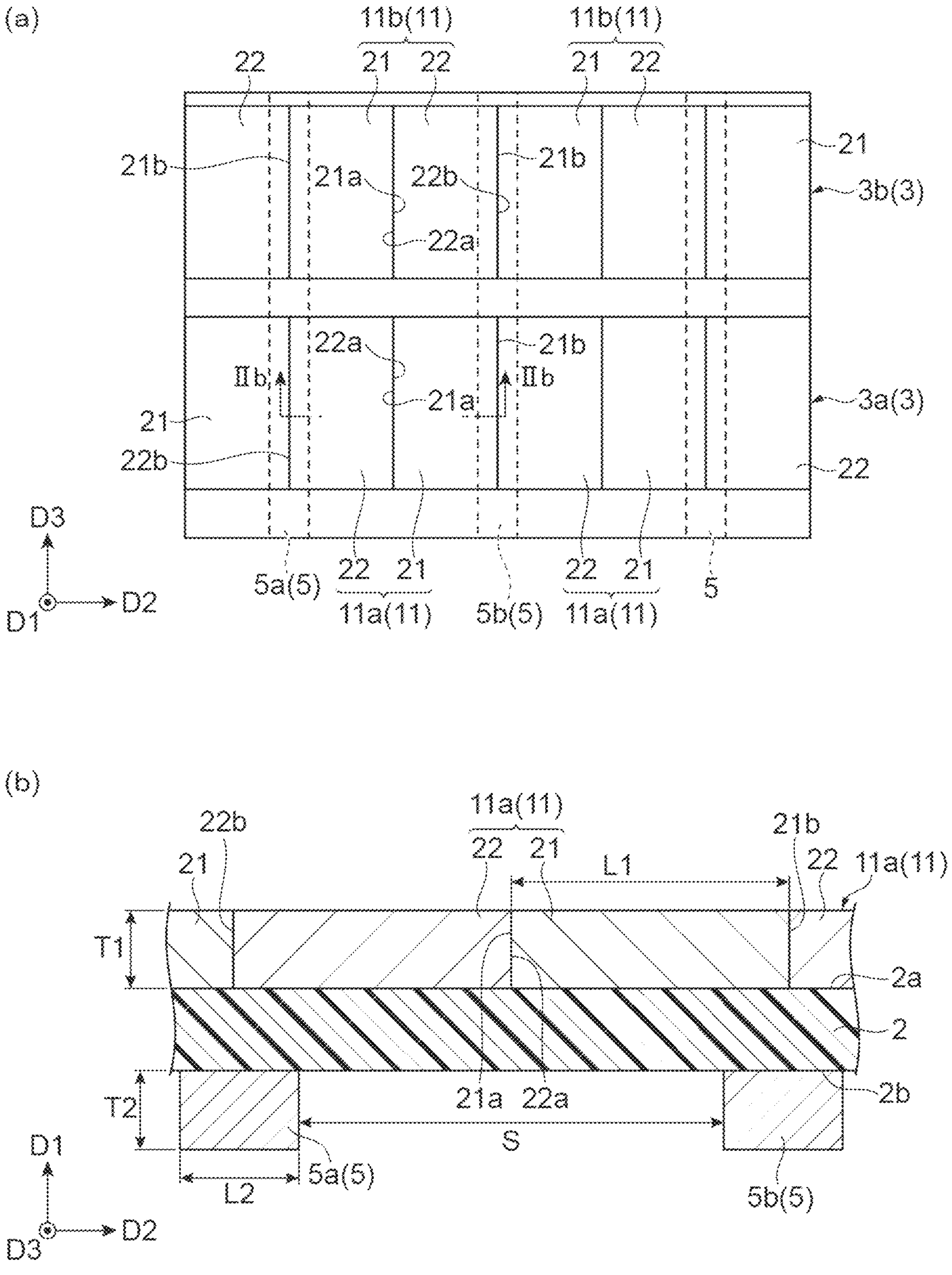
FIG. 2 (*a*) of FIG. 2 is an enlarged view of a part (a region surrounded by an alternate long and short dash line) of (a) of FIG. 1, and (b) of FIG. 2 is a cross-sectional view taken along line IIb-IIb of (a) of FIG. 2.

First, a configuration of a thermoelectric conversion module according to the present embodiment will be described with reference to FIGS. 1 and 2. (a) of FIG. 1 is a schematic plan view showing the thermoelectric conversion module according to the present embodiment, and (b) of FIG. 1 is a schematic bottom view showing the thermoelectric conversion module according to the present embodiment. (a) of FIG. 2 is an enlarged view of a part (a region surrounded by an alternate long and short dash line) of (a) of FIG. 1. (b) of FIG. 2 is a cross-sectional view taken along line IIb-IIb of (a) of FIG. 2.

A thermoelectric conversion module 1 shown in (a) and (b) of FIG. 1 is a device capable of generating power by being supplied with heat from the outside. The thermoelectric conversion module 1 is a so-called in-plane type device. Thus, the thermoelectric conversion module 1 is likely to be more excellent in workability and flexibility than, for example, a n-type element (cross-plane type element). Therefore, the thermoelectric conversion module 1 can be provided along the side surface of a cylindrical pipe or the like used for recovering factory exhaust heat, for example. That is, the thermoelectric conversion module 1 can be easily disposed at various positions. Therefore, the thermoelectric conversion module 1 is used, for example, as a power source for a plant sensor using exhaust heat. In addition, the contact resistance between the thermoelectric conversion material and the electrode included in the thermoelectric conversion module 1 is likely to be lower than that of the x-type module. In the following, the temperature of each component of the thermoelectric conversion module 1 is measured under natural convection conditions of air.

The thermoelectric conversion module 1 includes a substrate 2, a plurality of thermoelectric conversion groups 3, a plurality of conductive parts 4 and a plurality of thermal conduction parts 5. At least one of the substrate 2, the plurality of thermoelectric conversion groups 3, the plurality of conductive parts 4 and the plurality of thermal conduction parts 5 has a flexibility.

The substrate 2 is, a sheet member made of a resin showing heat resistance and flexibility, and, for example, has a substantially flat plate shape. Examples of the resin constituting the substrate 2 include a (meth)acrylic based resin, a (meth)acrylonitrile based resin, a polyamide based resin, a polycarbonate based resin, a polyether based resin, a polyester based resin, an epoxy based resin, an organosiloxane based resin, a polyimide based resin and a polysulfone based resin. The thickness of the substrate 2 is, for example, 5 μm or more and 50 μm or less. The thermal conductivity of the substrate 2 is, for example, 0.1 W/mK (corresponding to 0.1 watts per meter per Kelvin and 0.1 $W \times m^{-1} \times K^{-1}$) or more and 0.3 W/mK or less. The thermal conductivity of the substrate 2 is 0.3 W/mK or less, so that a temperature difference can occur in the thermoelectric conversion group 3. The thermal conductivity of the substrate 2 is measured by a steady state method or a non-steady state method.

The substrate 2 has a first main face 2*a* and a second main face 2*b* located on the opposite side of the first main face 2*a*. The first main face 2*a* and the second main face 2*b* are surfaces intersecting with a direction along the thickness of the substrate 2. The shapes of the first main face 2*a* and the second main face 2*b* is not particularly limited, and are, for example, a polygonal shape, a circular shape, an elliptical shape or the like. Hereinafter, a direction along the thickness of the substrate 2 is simply referred to as a thickness direction D1. Viewing from the thickness direction D1 corresponds to a plan view. Further, directions orthogonal to the thickness direction D1 are referred to as a first direction D2 and a second direction D3.

A thermoelectric conversion region R1 and two conductive regions R2 are defined on the first main face 2*a*. A plurality of thermoelectric conversion groups 3 are provided in the thermoelectric conversion region R1. A plurality of conductive parts 4 are provided in each conductive region R2. The thermoelectric conversion region R1 is located between the two conductive regions R2 in the first direction D2. The higher the percentage of the thermoelectric conversion region R1 occupied on the first main face 2*a* is, the higher output of the thermoelectric conversion module 1 is likely to be. In a plan view, the thermoelectric conversion region R1 accounts for, for example, 50% or more and 90% or less, in the area of the first main face 2*a*. In a plan view, the two conductive regions R2 accounts for, for example, 5% or more and 30% or less, in the area of the first main face 2*a*. In this case, the thermoelectric conversion module 1 can exhibit excellent output while reliably forming a conductive path connecting the thermoelectric conversion groups 3 to each other.

Each of the plurality of thermoelectric conversion groups 3 is a portion capable of generating power by being supplied with heat from the outside, and is located on the first main face 2*a*. The thermoelectric conversion groups 3 extend along the first direction D2 and are arranged along the second direction D3. Each of the thermoelectric conversion groups 3 has a band shape when viewed from the thickness direction D1. Each thermoelectric conversion group 3 is electrically connected to each other in series while being spaced apart from each other. In the first direction D2, one end of each thermoelectric conversion group 3 is connected to one of the plurality of conductive parts 4 included in one conductive region R2, and the other end of each thermoelectric conversion group 3 is connected to one of the plurality of conductive parts 4 included in the other conductive region R2. Each of the plurality of thermoelectric conversion groups 3 includes a plurality of thermoelectric conversion parts 11. In the present embodiment, each thermoelectric conversion group 3 includes ten thermoelectric conversion parts 11, but is not limited thereto. In each thermoelectric conversion group 3, the plurality of thermoelectric conversion parts 11 are arranged along the first direction D2. Two thermoelectric conversion parts 11 adjacent to each other in the first direction D2 are in contact with each other and are connected in series.

Hereinafter, one thermoelectric conversion group 3 of the two thermoelectric conversion groups 3 illustrated in (a) of FIG. 2 may be referred to as a first thermoelectric conversion group 3*a*, and the other thermoelectric conversion group 3 located adjacent to the first thermoelectric conversion group 3*a* along the second direction D3 may be referred to as a second thermoelectric conversion group 3*b*. Further, the thermoelectric conversion part 11 included in the first thermoelectric conversion group 3*a* may be referred to as a first thermoelectric conversion part 11*a*, and the thermoelectric conversion part 11 included in the second thermoelectric conversion group 3*b* may be referred to as a second thermoelectric conversion part 11*b*. A plurality of the first thermoelectric conversion parts 11*a* included in the first thermoelectric conversion group 3*a* is arranged in order along the first direction D2, a plurality of the second thermoelectric conversion parts 11*b* included in the second thermoelectric conversion group 3*b* is arranged in order along the first direction D2. The first thermoelectric conversion part 11*a* and the second thermoelectric conversion part 11*b* are adjacent to each other along the second direction D3.

Each of the plurality of thermoelectric conversion parts 11 is a part in which thermoelectric conversion is performed in the thermoelectric conversion module 1, and has a flexibility. The shape of the thermoelectric conversion part 11 in a plan view is not particularly limited, and is, for example, a polygonal shape, a circular shape, an elliptical shape or the like. A p-type thermoelectric conversion element 21 and an n-type thermoelectric conversion element 22 have an identical shape as each other, but are not limited thereto. Each thermoelectric conversion part 11 has the p-type thermoelectric conversion element 21 and the n-type thermoelectric conversion element 22 arranged along the first direction D2. In each thermoelectric conversion part 11, a first end part 21*a* of the p-type thermoelectric conversion element 21 in the first direction D2 and a first end part 22*a* of the n-type thermoelectric conversion element 22 in the first direction D2 are in contact with each other. In each thermoelectric conversion part 11, a second end part 21*b* of the p-type thermoelectric conversion element 21 in the first direction D2 is located at one end of the corresponding thermoelectric conversion part 11, and a second end part 22*b* of the n-type thermoelectric conversion element 22 in the first direction D2 is located at the other end of the corresponding thermoelectric conversion part 11. In two thermoelectric conversion parts 11 adjacent to each other in the first direction D2, the second end part 21*b* of the p-type thermoelectric conversion element 21 included in one thermoelectric conversion part 11 and the second end part 22*b* of the n-type thermoelectric conversion element 22 included in the other thermoelectric conversion part 11 are in contact with each other.

In each of the plurality of thermoelectric conversion groups 3, the p-type thermoelectric conversion element 21 and the n-type thermoelectric conversion element 22 are alternately arranged in the first direction D2. As shown in (a) of FIG. 2, in the present embodiment, the p-type thermoelectric conversion element 21 of the first thermoelectric conversion part 11*a* is located adjacent to the n-type thermoelectric conversion element 22 (a second n-type thermoelectric conversion element) of the second thermoelectric conversion part 11*b* in the second direction D3, and the n-type thermoelectric conversion element 22 of the first thermoelectric conversion part 11*a* is located adjacent to the p-type thermoelectric conversion element 21 (a second p-type thermoelectric conversion element) of the second thermoelectric conversion part 11*b* in the second direction D3.

The p-type thermoelectric conversion element 21 is provided on the first main face 2*a* of the substrate 2 and in contact with the n-type thermoelectric conversion element 22. The thickness T1 of the p-type thermoelectric conversion element 21 is, for example, 3 μm or more and 30 μm or less. Since the thickness T1 is 3 μm or more, the electric resistance of the p-type thermoelectric conversion element 21 can be favorably reduced. Since the thickness T1 is 30 μm or less, a temperature gradient can be easily formed inside the p-type thermoelectric conversion element 21. The thickness T1 may be 5 μm or more, 8 μm or more, 10 μm or more, 25 μm or less, 20 μm or less, or 15 μm or less. The length L1 of the p-type thermoelectric conversion element 21 in the first direction D2 is, for example, 2 mm or more and 10 mm or less. In this case, a temperature gradient can be easily formed inside the p-type thermoelectric conversion element 21. The length of the p-type thermoelectric conversion element 21 in the second direction D3 is, for example, 5 mm or more and 30 mm or less. In this case, a sufficient number of thermoelectric conversion parts 11 can be formed on the first main face 2*a*. The thermal conductivity of the p-type thermoelectric conversion element 21 in the in-plane direction is, for example, 20.0 W/mK or more and 35.0 W/mK or less. The thermal conductivity may be 22.0 W/mK or more, 23.0 W/mK or more, 25.0 W/mK or more, 32.0 W/mK or less, 30.0 W/mK or less or 28.0 W/mK or less. The thermal conductivity of the p-type thermoelectric conversion element 21 in the in-plane direction is measured by, for example, an optical alternating current method or a 3-omega method. The p-type thermoelectric conversion element 21 is formed by, for example, various dry methods or wet methods. Examples of the wet method include a doctor blade method, a dip coating method, a spray coating method, a spin coating method, and an ink jet method or the like.

The p-type thermoelectric conversion element 21 is, for example, a p-type semiconductor layer. The p-type thermoelectric conversion element 21 includes, for example, carbon nanotubes (CNTs) and conductive resin different from the carbon nanotubes. The carbon nanotube exhibits p-type. The carbon nanotube may be single-walled, double-walled or multi-walled. From the viewpoint of the electrical conductivity of the p-type thermoelectric conversion element 21, single-walled carbon nanotubes (SWCNTs) may be used. The percentage of the single-walled carbon nanotubes in the total amount of the carbon nanotubes may be 25% by mass or more, 50% by mass or more, or 100% by mass. The diameter of the single-walled carbon nanotube is not particularly limited, and is, for example, 20 nm or less, 10 nm or less, or 3 nm or less. The lower limit of the diameter of the single-walled carbon nanotube is also not particularly limited, but may be 0.4 nm or more, or may be 0.5 nm or more. The thermal conductivity of the carbon nanotube is, for example, 30 W/mK or more and 40 W/mK or less.

In the present specification, the diameter of the single-walled carbon nanotube can be determined by formula: "Diameter (nm)=248/ω" using the wave number (ω ($cm^{-1}$)) of a peak appearing at 100 to 300 $cm^{-1}$ by Raman spectroscopy. As a method for evaluating the single-walled carbon nanotube, a G/D ratio in laser Raman spectroscopy is known. In the present embodiment, the G/D ratio of the single-walled carbon nanotube in laser Raman spectroscopy at a wavelength of 532 nm may be 10 or more or 20 or more. By using such a single-walled carbon nanotube, there is a tendency that the p-type thermoelectric conversion element 21 having further excellent electrical conductivity is obtained. Note that, the upper limit of the G/D ratio is not particularly limited, and may be, 500 or less or 300 or less.

The conductive resin of the present embodiment is not particularly limited, and a known conductive resin can be used without particular limitation. Examples of the conductive resin include those including a polyaniline-based conductive resin, a polythiophene-based conductive resin, a polypyrrole-based conductive resin, a polyacetylene-based conductive resin, a polyphenylene-based conductive resin, a polyphenylenevinylene-based conductive resin and the like. As the polythiophene-based conductive resin, poly(3, 4-ethylenedioxythiophene) (PEDOT) can be exemplified. In the present embodiment, the conductive resin includes PEDOT and an electron acceptor. In this case, there is a tendency that the electrical conductivity of the p-type thermoelectric conversion element 21 is further enhanced. Examples of the electron acceptor include polystyrene sulfonic acid, polyvinyl sulfonic acid, poly(meth)acrylic acid, polyvinyl sulfonic acid, toluenesulfonic acid, dodecylbenzenesulfonic acid, camphorsulfonic acid, bis(2-ethylhexyl) sulfosuccinate, chlorine, bromine, iodine, phosphorus pentafluoride, arsenic pentafluoride, boron trifluoride, hydrogen chloride, sulfuric acid, nitric acid, tetrafluoroboric acid, perchloric acid, iron (III) chloride, tetracyanoquinodimethane and the like. In view of the electrical conductivity of the p-type thermoelectric conversion element 21, the electron acceptor may be polystyrene sulfonic acid (PSS). The thermal conductivity of the conductive resin is significantly lower than the thermal conductivity of the carbon nanotube and is, for example, 1 W/mK or less.

In the p-type thermoelectric conversion element 21, the carbon nanotube and the conductive resin may aggregate. The p-type thermoelectric conversion element 21 may include a porous structure in which carbon nanotubes are bonded to each other by the conductive resin.

The n-type thermoelectric conversion element 22 is provided on the first main face 2*a* of the substrate 2 and is in contact with the p-type thermoelectric conversion element 21. The thickness of the n-type thermoelectric conversion element 22 is identical to or substantially identical to the thickness T1 of the p-type thermoelectric conversion element 21. The length of the n-type thermoelectric conversion element 22 in the first direction D2 is identical to or substantially identical to the length L1 of the p-type thermoelectric conversion element 21. The length of the n-type thermoelectric conversion element 22 in the second direction D3 is, for example, 2 mm or more and 10 mm or less. In this case, a sufficient number of thermoelectric conversion parts 11 can be formed on the first main face 2*a*. The thermal conductivity of the n-type thermoelectric conversion element 22 in the in-plane direction is, for example, 25.0 W/mK or more and 37.0 W/mK or less. The thermal conductivity may be 26.0 W/mK or more, 28.0 W/mK or more, 30.0 W/mK or more, 35.0 W/mK or less, or 32.0 W/mK or less. The thermal conductivity of the n-type thermoelectric conversion element 22 in the in-plane direction is measured by, for example, an optical alternating current method or a 3-omega method. As same as the p-type thermoelectric conversion element 21, the n-type thermoelectric conversion element 22 is formed by, for example, various dry methods or wet methods.

The n-type thermoelectric conversion element 22 is, for example, an n-type semiconductor layer. The n-type thermoelectric conversion element 22 includes, for example, a composite of a plurality of organic substances or a composite of an inorganic substance and an organic substance. In the present embodiment, the n-type thermoelectric conversion element 22 is a portion that exhibits n-type by including a dopant in the p-type thermoelectric conversion element 21. Therefore, the n-type thermoelectric conversion element 22 includes a carbon nanotube, a conductive resin and a dopant. In the present embodiment, dopant means a substance which changes a Seebeck coefficient of a portion to be doped with the dopant. The expression "changing a Seebeck coefficient" means decreasing a Seebeck coefficient value or changing a Seebeck coefficient value from a positive value to a negative value. A thermoelectric conversion material having a positive Seebeck coefficient value has p-type conductivity, and a thermoelectric conversion material having a negative Seebeck coefficient value has an n-type material.

The dopant of the present embodiment, for example, contains: a coordination compound capable of dissociating into an anion that is a complex ion (hereinafter, also simply referred to as "anion") and an alkali metal cation (hereinafter, also simply referred to as "cation"); and a cation scavenger (hereinafter, also simply referred to as "scavenger"). Within the n-type thermoelectric conversion element 22, at least a part of the coordination compound may be dissociated into the anion and the cation. In this case, the cation may be captured by the scavenger. The dopant may contain plural kinds of at least one of a coordination compound and a scavenger. In the portion where the p-type thermoelectric conversion element 21 contains the dopant, the Seebeck coefficient changes. As a result, the n-type thermoelectric conversion element 22 is formed in the above portion.

The reason why the above-described effect is exhibited is not particularly limited, and as one of the causes it is conceivable that the scavenger contained in the dopant captures the cation to dissociate the anion and the anion changes a carrier of the carbon nanotube from a hole to an electron. At this time, in the present embodiment, since the anion is a complex ion having a metal atom at the center, it is conceivable that the n-type conversion is significantly performed by an interaction between the metal atom and the carbon nanotube. It is also conceivable to exhibit the above-described effect because the ionic size of the complex ion is large so that the dissociation of the complex ion from the cation captured by the scavenger is favorable. In the dopant of the present embodiment, the anion is a complex ion. Thus, the n-type thermoelectric conversion element 22 contains the metal atom derived from the complex ion. Therefore, in the present embodiment, the metal atom remaining in the n-type thermoelectric conversion element 22 can function as an antioxidant.

The complex ion (anion) obtained by dissociation of the coordination compound may be selected from the group consisting of ferrocyanide ions, ferricyanide ions, tetrachloroferrate (III) ions, tetrachloroferrate(II) ions, tetracyanonickelate(II) ions, tetrachloronickelate(II) ions, tetracyanocobaltate(II) ions, tetrachlorocobaltate(II) ions, tetracyanocuprate(I) ions, tetrachlorocuprate(II) ions, hexacyanochromate(III) ions, tetrahydroxidozincate(II) ions and tetrahydroxidoaluminate(III) ions. The anion may be ferrocyanide ions. When the anion is ferrocyanide ions, a material having more favorable characteristics is obtained. Furthermore, when the anion is a ferrocyanide ion, there are tendencies that the iron atom remaining in the n-type thermoelectric conversion element 22 suitably functions as an antioxidant, that a change in physical properties over time is further suppressed and that the storage stability is further improved.

The anion may include an iron atom. That is, the coordination compound may include the iron atom. In this case, the anion may be selected, for example, from the group consisting of ferrocyanide ions, ferricyanide ions, tetrachloroferrate (III) ions and tetrachloroferrate (II) ions. In view of the characteristics of the n-type thermoelectric conversion element 22, the anion including the iron atom may be ferrocyanide ions. From the viewpoint of the antioxidant effect, the content of the iron atom in the n-type thermoelectric conversion element 22 may be 0.001% by mass or more and 15% by mass or less, may be 0.005% by mass or more and 12% by mass or less, or may be 0.01% by mass or more and 10% by mass or less. The content of the iron atom in the n-type thermoelectric conversion element 22 indicates a value measured by, for example, ICP emission spectrometry.

The coordination compound may be a complex salt. Examples of the complex salt include potassium ferrocyanide, sodium ferrocyanide, potassium ferricyanide, sodium ferricyanide, potassium tetrachloroferrate (III), sodium tetrachloroferrate (III), potassium tetrachloroferrate (II), sodium tetrachloroferrate (II) and the like. The complex salt may be a hydrate.

Examples of the alkali metal cation obtained by dissociation of the coordination compound include a sodium ion, a potassium ion, a lithium ion and the like. The coordination compound may include at least one of a ferrocyanide compound and a ferricyanide compound.

The cation scavenger is not particularly limited as long as it is a substance which is capable of taking in a cation. Examples of the cation scavenger include a crown ether-based compound, cyclodextrin, calixarene, ethylenediaminetetraacetate, porphyrin, phthalocyanine, derivatives thereof and the like. In the present embodiment, the cation scavenger is a crown ether-based compound. Examples of the crown ether-based compound include 15-crown-5-ether, 18-crown-6-ether, 12-crown-4-ether, benzo-18-crown-6-ether, benzo-15-crown-5-ether, benzo-12-crown-4-ether and the like. The ring size of the crown ether used as the scavenger may be selected in accordance with the size of the metal ion to be taken in. For example, in a case where the metal ion is a potassium ion, the crown ether-based compound may be an 18-membered ring crown ether. In a case where the metal ion is a sodium ion, the crown ether-based compound may be a 15-membered ring crown ether. In a case where the metal ion is a lithium ion, the crown ether-based compound may be a 12-membered ring crown ether.

The crown ether-based compound may contain a benzene ring. In this case, the stability of the crown ether-based compound may be improved. Examples of the crown ether-based compound having a benzene ring include benzo-18-crown-6-ether, benzo-15-crown-5-ether, benzo-12-crown-4-ether and the like.

A molar ratio ($C_2/C_1$) of a content $C_2$ of the scavenger with respect to a content $C_1$ of the cation may be 0.1 or more and 5 or less, 0.3 or more and 3 or less, or 0.5 or more and 2 or less.

In each of the plurality of thermoelectric conversion parts 11, a mass percentage of the carbon nanotubes in the total mass of the thermoelectric conversion part 11 is, for example, 30% or more and 70% or less. When the mass percentage is 30% or more, the thermoelectric conversion part 11 can have excellent electrical conductivity. When the mass percentage is 70% or less, the temperature difference in the thermoelectric conversion part 11 tends to be large. The mass percentage may be 35% or more, 40% or more, 45% or more, or 50% or more. The mass percentage may be 65% or less, 60% or less, or 55% or less. The mass percentage of the carbon nanotubes in the total mass of the p-type thermoelectric conversion element 21 may be 30% or more and 70% or less, and the mass percentage of the carbon nanotubes in a total mass of the n-type thermoelectric conversion element 22 may be 30% or more and 70% or less. In each of the plurality of thermoelectric conversion groups 3, the mass percentage of the carbon nanotubes in the total mass of the thermoelectric conversion group 3 may be 30% or more and 70% or less, or 40% or more and 60% or less. The internal temperature difference of the thermoelectric conversion part 11 or the like is measured using, for example, a thermography.

Each of the plurality of conductive parts 4 is a conductive part located on the first main face 2*a* and is connected to the corresponding thermoelectric conversion group 3. Each conductive part 4 may be a semiconductor instead of a conductor. The thickness of each conductive part 4 is identical or substantially identical to the thickness T1 of the p-type thermoelectric conversion element 21. The conductivity of each conductive part 4 may be equal to or higher than the conductivity of the p-type thermoelectric conversion element 21. The thermal conductivity of each conductive part 4 may be equal to or higher than the thermal conductivity of the p-type thermoelectric conversion element 21. At least a part of the plurality of conductive parts 4 may have a single-layer structure or a laminated structure. For example, at least a part of the plurality of conductive parts 4 may have an organic conductive layer and a metal conductive layer located on the organic conductive layer. In the present embodiment, the plurality of conductive parts 4 are formed of the identical material as the p-type thermoelectric conversion element 21. Therefore, each conductive parts 4 has identical conductivity type (p-type).

The plurality of conductive parts 4 include a first conductive part 4*a* functioning as a terminal connected to the external device and a second conductive part 4*b* functioning as a conductive path connecting the adjacent thermoelectric conversion groups 3 to each other. The plurality of conductive parts 4 have two first conductive parts 4*a*, and the two first conductive parts 4*a* are located in one conductive region R2. Only the second conductive parts 4*b* are provided in the other conductive region R2. The plurality of thermoelectric conversion groups 3 are connected in series to each other via a plurality of second conductive parts 4*b*. Thus, when the thermoelectric conversion module 1 is performing thermoelectric conversion, current can flow in series from one first conductive part 4*a* to the other first conductive part 4*a*. For example, one first conductive part 4*a* located in one conductive region R2 is connected to one end of the first thermoelectric conversion group 3*a* in the first direction D2, and one second conductive part 4*b* located in the other conductive region R2 is connected to the other end of the first thermoelectric conversion group 3*a* and one end of the second thermoelectric conversion group 3*b* in the first direction D2.

The plurality of thermal conduction parts 5 are portions exhibiting higher thermal conductivity than the substrate 2, and are located on the second main face 2*b*. At least a part of the plurality of thermal conduction parts 5 overlaps the thermoelectric conversion group 3 (that is, the thermoelectric conversion part 11) in the thickness direction D1. More specifically, at least a part of the plurality of thermal conduction parts 5 overlaps an end of the thermoelectric conversion part 11. On the other hand, each thermal conduction part 5 does not overlap the center of the thermoelectric conversion part 11. Accordingly, a temperature gradient inside the thermoelectric conversion part 11 along the first direction D2 may be favorably generated. The plurality of thermal conduction parts 5 are spaced apart from each other along the first direction D2, and have a band shape extending along the second direction in a plan view. The shape of each thermal conduction part 5 in a plan view is not particularly limited, and is, for example, a polygonal shape, a circular shape, an elliptical shape or the like. Each thermal conduction part 5 includes, for example, metal (silver, copper, aluminum or the like), carbon, resin (for example, silicone resin, epoxy-based resin, (meth) acrylic-based resin) or the like. Each thermal conduction part 5 may include a ceramic such as boron nitride, aluminum nitride or the like that exhibits high thermal conductivity. From the viewpoint of manufacturing efficiency, each thermal conduction part 5 may include the resin described above. In this case, the thermal conduction part 5 may be formed using the resin or a solution containing the resin. The thermal conductivity of each thermal conduction part 5 is, for example, 1 W/mK or more and 400 W/mK or less. Accordingly, when the thermoelectric conversion module 1 is heated, heat is favorably transferred to the thermoelectric conversion part 11 via the plurality of thermal conduction parts 5. The thermal conductivity of each thermal conduction part 5 is measured by a steady state method or a non-steady state method.

The length T2 of each thermal conduction part 5 along the thickness direction D1 is, for example, 50 μm or more and 2,000 μm or less. The width L2 of each thermal conduction part 5 along the first direction D2 is, for example, 0.5 mm or more and 2.0 mm or less. In these cases, the thermal conduction function of each thermal conduction part 5 can be favorably exhibited. In two adjacent thermal conduction parts 5, the interval S along the first direction D2 is greater than the length L1 of the p-type thermoelectric conversion element 21 in the first direction D2 and the length of the n-type thermoelectric conversion element 22 in the first direction D2. The interval S is 3 mm or more and 15 mm or less. The interval S may be greater than or equal to 4 mm, greater than or equal to 5 mm, or greater than or equal to 6 mm. The interval S may be less than or equal to 12 mm, less than or equal to 10 mm, or less than or equal to 8 mm. Alternatively, the interval S may be less than 12 mm or less than 10 mm.

Hereinafter, one thermal conduction part 5 of the two thermal conduction parts 5 illustrated in (b) of FIG. 2 may be referred to as a first thermal conduction part 5*a*, and the other thermal conduction part 5 located adjacent to the first thermal conduction part 5*a* along the first direction D2 may be referred to as a second thermal conduction part 5*b*. In this case, in the thickness direction D1, the first thermal conduction part 5*a* overlaps one end of the first thermoelectric conversion part 11*a* in the first direction D2. Further, in the thickness direction D1, the second thermal conduction part 5*b* overlaps the other end of the first thermoelectric conversion part 11*a* in the first direction D2. More specifically, in the thickness direction D1, the first thermal conduction part 5*a* overlaps the second end part 22*b* of the n-type thermoelectric conversion element 22 included in the first thermoelectric conversion part 11*a*, and the second thermal conduction part 5*b* overlaps the second end part 21*b* of the p-type thermoelectric conversion element 21 included in the first thermoelectric conversion part 11*a*. In addition, as shown in (a) of FIG. 2, in the thickness direction D1, the first thermal conduction part 5*a* overlaps the second end part 21*b* of the p-type thermoelectric conversion element 21 included in the second thermoelectric conversion part 11*b*, and the second thermal conduction part 5*b* overlaps the second end part 22*b* of the n-type thermoelectric conversion element 22 included in the second thermoelectric conversion part 11*b*.

The thermoelectric conversion module 1 may further include configurations other than those described above. For example, the thermoelectric conversion module 1 may include wiring for electrically connecting another thermoelectric conversion module, wiring for taking out power to an external circuit, and the like.

Next, an example of a method for manufacturing the thermoelectric conversion module 1 according to the present embodiment will be described with reference to FIGS. 3 to 5. (a) to (c) of FIG. 3, (a) and (b) of FIG. 4, and (a) and (b) of FIG. 5 illustrate a method for manufacturing a thermoelectric conversion module according to the present embodiment.

Figure 3:
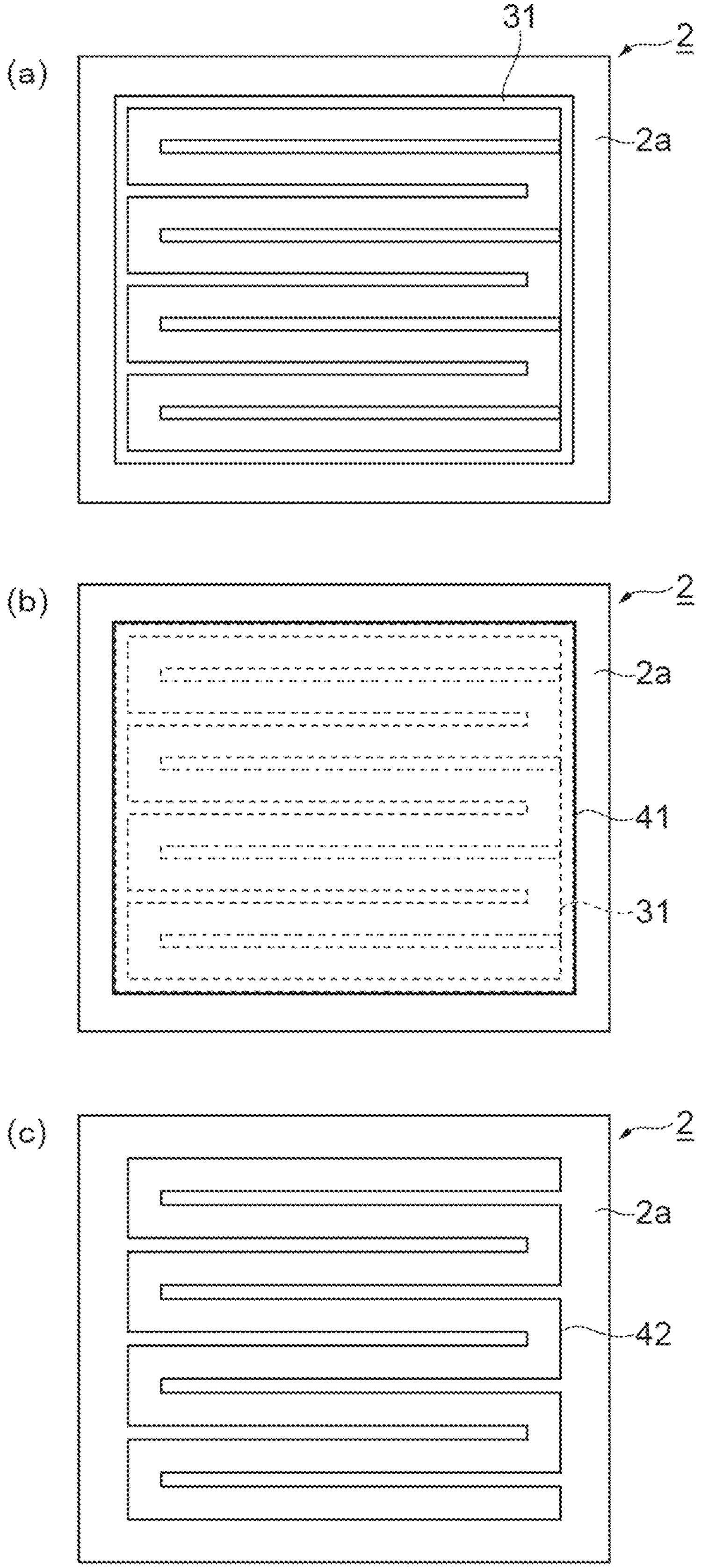
FIG. 3 (*a*) to (*c*) of FIG. 3 are views for describing a method for manufacturing a thermoelectric conversion module according to an embodiment.

First, as shown in (a) of FIG. 3, a mask 31 is formed on the first main face 2*a* of the substrate 2 prepared in advance (first step). In the first step, the mask 31 is formed in a predetermined region of the first main face 2*a*. The mask 31 is a resist mask, a masking tape or the like. In the former case, the mask 31 is formed by known patterning. In the latter case, the tape is fixed to the predetermined region.

Next, as shown in (b) of FIG. 3, a first layer 41 is formed on the first main face 2*a* (second step). In the second step, first, a dispersion liquid is dropped onto the first main face 2*a* by a known method such as an inkjet method, a dispensing method, a doctor-blade method, a screen printing method, a casting method, a dip coating method, or a spray coating method. Subsequently, the first layer 41 is formed by drying the dispersion liquid. For example, the substrate 2 is heated by placing the substrate 2 on a hotplate set at 25° C. or more and 90° C. or less for 10 minutes or more and 21,600 minutes or less. Thereby, the dispersion liquid is dried to form the first layer 41. In the second step, instead of placing the substrate 2 on a hotplate, the dispersion liquid may be dried by housing the substrate 2 in a blowing and drying oven for 10 minutes or more and 21,600 minutes or less.

The dispersion liquid used in the second step is, for example, a liquid in which the p-type thermoelectric conversion material is dispersed. In the present embodiment, the dispersion liquid is a liquid in which the carbon nanotube and the conductive resin are dispersed. The content of the carbon nanotubes in the dispersion liquid is, for example, 25% by mass or more, 30% by mass or more, 35% by mass or more or 40% by mass or more and 80% by mass or less, 75% by mass or less, 70% by mass or less or 60% by mass or less, based on the total amount of the conductive resin and the carbon nanotubes. In this case, the temperature difference is likely to occur in the first layer 41, and the electrical conductivity of the first layer 41 tends to increase. In addition, in each of the plurality of thermoelectric conversion parts 11 described later, a mass percentage of the carbon nanotubes in the total mass of the thermoelectric conversion part 11 is easily adjusted to 30% or more and 70% or less. The total mass concentration of the carbon nanotubes and the conductive resin in the dispersion liquid is, for example, 0.05% by mass or more, 0.06% by mass or more, 0.07% by mass or more, 0.10% by mass or more, 0.12% by mass or more or 0.15% by mass or more. The total mass concentration of the carbon nanotubes and the conductive resin in the dispersion may be 10% by mass or less, or 2% by mass or less. The dispersion liquid used in the second step is, for example, a mixed liquid formed by mixing a first liquid containing a carbon nanotube and a second liquid containing a conductive resin. The content of the carbon nanotubes in the dispersion liquid based on the total amount of the conductive resin and the carbon nanotubes is substantially equal to the mass percentage of the carbon nanotubes in the total mass of the thermoelectric conversion part 11. Therefore, in the present specification, the content of the carbon nanotubes in the dispersion liquid based on the total amount of the conductive resin and the carbon nanotubes can be regarded as the mass percentage of the carbon nanotubes in the total mass of the thermoelectric conversion part 11.

The first liquid includes, for example, the carbon nanotube and a first solvent. The concentration of the carbon nanotubes in the first solvent is, for example, 0.01% by mass or more and 10% by mass or less. The first solvent may be a solvent capable of dispersing the carbon nanotube, and is, for example, a polar liquid or an aqueous solvent. The aqueous solvent is water or a mixed solvent of water and an organic solvent. The first solvent may be a protic solvent or an aprotic solvent. Specific examples of the first solvent include water, alcohols (such as methanol and ethanol), amides (such as N, N-dimethylformamide, N, N-dimethylacetamide and N-methylpyrrolidone), ketones (such as acetone and methyl ethyl ketone), glycols (such as ethylene glycol and diethylene glycol), dimethyl sulfoxide, acetonitrile or the like. The first solvent may include one or more selected from the group consisting of water, methanol, ethanol, N-methylpyrrolidone and dimethyl sulfoxide, and may include water. The first liquid may further include additives such as a surfactant and an organic binder.

The second liquid includes, for example, a conductive resin made of PEDOT and PSS (PEDOT/PSS) and a second solvent. In the PEDOT/PSS, the content ratio of PEDOT and PSS is not particularly limited. The ratio (mass ratio) of PSS to PEDOT is, for example, 1 or more, 1.25 or more, or 1.5 or more and 30 or less, or 20 or less. The second solvent may be a solvent capable of dispersing PEDOT/PSS, and is, for example, a polar liquid or an aqueous solvent. The second solvent may be a protic solvent or an aprotic solvent. Specific examples of the second solvent are identical to the specific examples of the first solvent. The second solvent may include one or more of the group consisting of water, methanol and ethanol, and may include water. In one embodiment, the second liquid may be an aqueous dispersion liquid of PEDOT/PSS. The second solvent may be used alone or as a mixture of two or more. The second liquid may further include various additives.

Next, as shown in (c) of FIG. 3, the mask 31 is removed, and then the substrate 2 is immersed in an organic solvent to form the p-type thermoelectric conversion layer 42 (third step). For example, in the case where the mask 31 is a resist mask, the mask 31 is removed by light, a solvent or the like. In this case, as the organic solvent, a solvent or the like that does not affect the dispersion liquid is used. For example, in the case where the mask 31 is a masking tape, the mask 31 is physically peeled off from the substrate 2. In the present embodiment, after patterning of the first layer 41, the entire substrate 2 is immersed in dimethylsulfoxide (DMSO) of the above-described organic solvent (immersion treatment). For example, the entire substrate 2 is immersed in dimethylsulfoxide set at room temperature for 1 minute or more and 7,200 minutes or less. After the immersion treatment, the substrate 2 may be heated from the second main face 2*b* side. For example, the substrate 2 is heated by placing the substrate 2 on a hotplate set at 25° C. or more and 90° C. or less for 10 minutes or more and 21,600 minutes or less. Through the above process, the patterned p-type thermoelectric conversion layer 42 is formed. A part of the p-type thermoelectric conversion layer 42 is to be the n-type thermoelectric conversion element 22 later. Another part of the p-type thermoelectric conversion layer 42 is to be the p-type thermoelectric conversion element 21 later. Still another part of the p-type thermoelectric conversion layer 42 is to be the conductive part 4 later.

Figure 4:
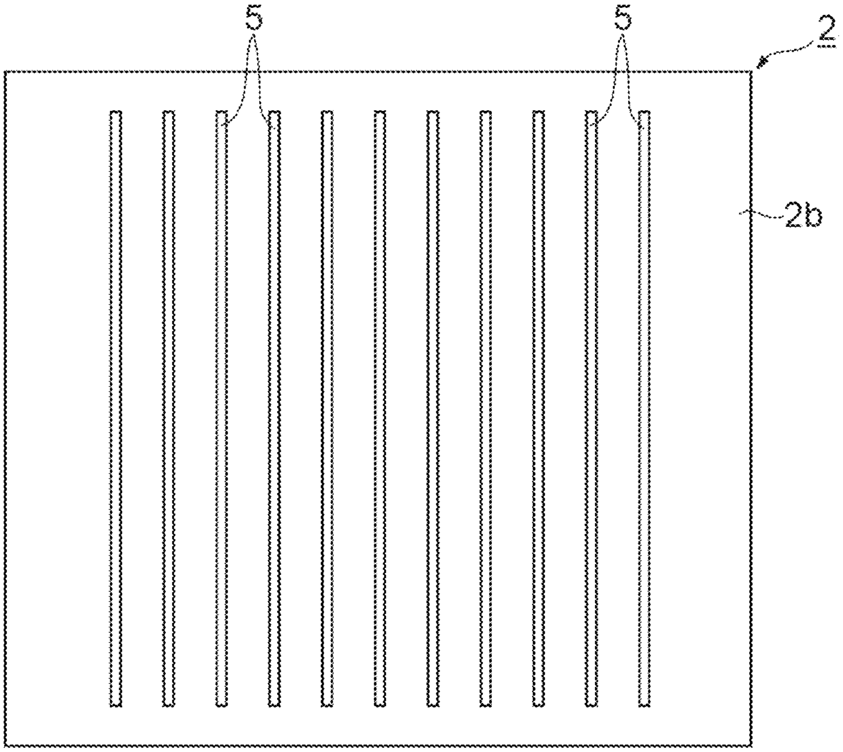
FIG. 4 (*a*) and (*b*) of FIG. 4 are views for describing a method for manufacturing a thermoelectric conversion module according to an embodiment.
Figure 4:
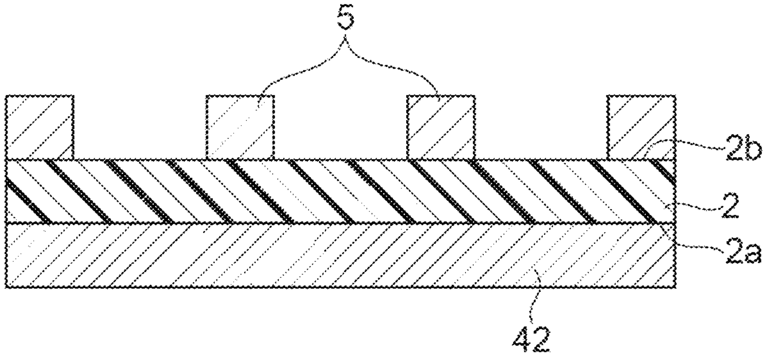
Figure 5:
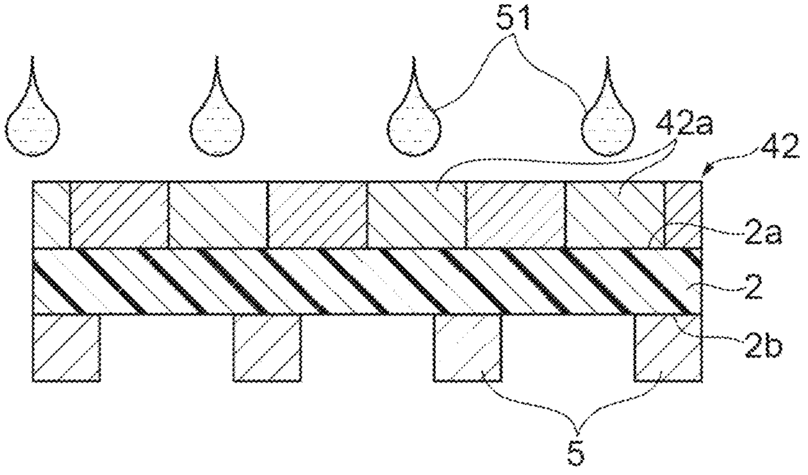
FIG. 5 (*a*) and (*b*) of FIG. 5 are views for describing a method for manufacturing a thermoelectric conversion module according to an embodiment.
Figure 5:
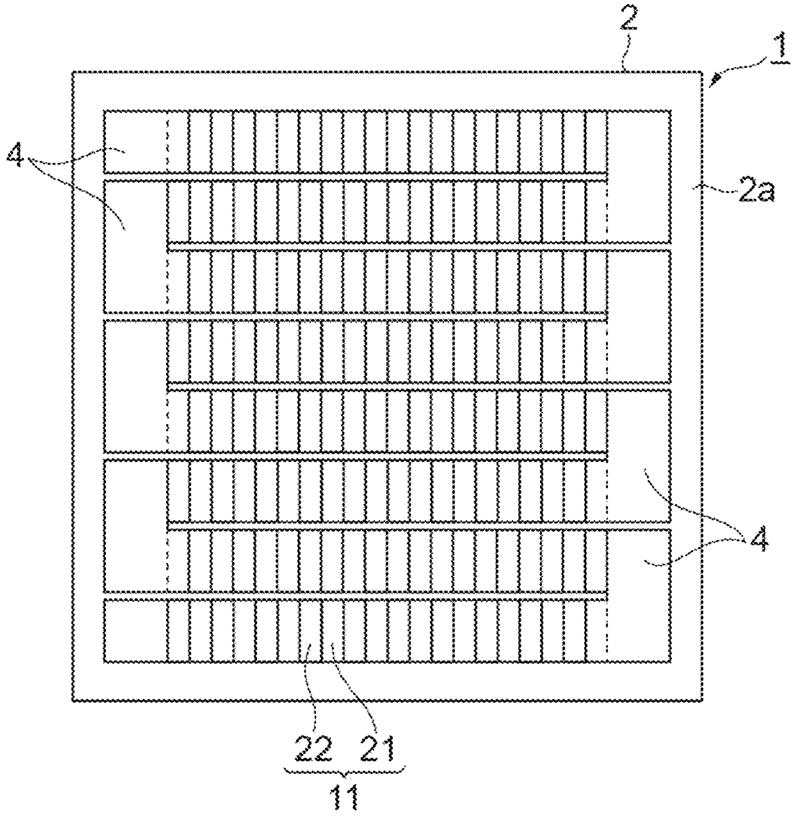

Next, as shown (a) and (b) of FIG. 4, after the above third step, a plurality of thermal conduction parts 5 are formed on the second main face 2*b* of the substrate 2 (fourth step). In the fourth step, a high thermal conduction material is coated by a known method such as an inkjet method, a dispensing method, a doctor-blade method or a screen printing method. Subsequently, the plurality of thermal conduction parts 5 are formed by heating and curing the high thermal conduction material.

Next, as shown in (a) of FIG. 5, after the fourth step, a dopant-containing solution (dopant solution 51) is dropped onto a part 42*a* of the p-type thermoelectric conversion layer 42. Thus, the n-type thermoelectric conversion element 22 is formed in the part 42*a* (fifth step). In the fifth step, the part 42*a* of the p-type thermoelectric conversion layer 42 is impregnated with the dopant solution 51 by a known method such as an inkjet method or a dispensing method. In the present embodiment, in the p-type thermoelectric conversion layer 42, regions where the dopant solution 51 is dropped and regions where the dopant solution 51 is not dropped are alternately provided. Subsequently, the dopant solution 51 is dried so that the part 42*a* becomes an n-type thermoelectric conversion element 22. For example, the substrate 2 is heated by placing the substrate 2 on a hotplate set at 25° C. or more and 100° C. or less, or 25° C. or more and 90° C. or less for 10 minutes or more and 21,600 minutes or less. Thus, the dopant solution 51 is dried. The solvent contained in the dopant solution 51 is, for example, water, acetonitrile, ethanol, ethylene glycol, dimethyl sulfoxide (DMSO), N-methylpyrrolidone, N, N-dimethylformamide, N, N-dimethylacetamide or the like. A part of the p-type thermoelectric conversion layer 42 to which the dopant solution 51 is not dropped becomes the p-type thermoelectric conversion element 21 or the conductive part 4 as illustrated in (b) of FIG. 5. As described above, the thermoelectric conversion module 1 in which the plurality of thermoelectric conversion parts 11 are formed is formed.

Next, operations and effects achieved by the thermoelectric conversion module 1 formed by the manufacturing method according to the present embodiment described above will be described.

The thermoelectric conversion module 1 according to the present embodiment includes the first thermal conduction part 5*a* and the second thermal conduction part 5*b*, in the thickness direction D1, the first thermal conduction part 5*a* overlaps the second end part 22*b* of the n-type thermoelectric conversion element 22 included in the first thermoelectric conversion part 11*a*, and in the thickness direction D1, the second thermal conduction part 5*b* overlaps the second end part 22*b* of the p-type thermoelectric conversion element 21 included in the first thermoelectric conversion part 11*a*. In addition, the interval S between the first thermal conduction part 5*a* and the second thermal conduction part 5*b* in the first direction D2 is larger than the length L1 of the p-type thermoelectric conversion element 21 in the first direction D2 and the length of the n-type thermoelectric conversion element 22 in the first direction D2. Accordingly, each of the first thermal conduction part 5*a* and the second thermal conduction part 5*b* overlaps both ends of the first thermoelectric conversion part 11*a* in the thickness direction D1, whereas does not overlap the center of the first thermoelectric conversion part 11*a*. Therefore, for example, by heating the first thermal conduction part 5*a* and the second thermal conduction part 5*b*, an internal temperature difference can be generated in each of the p-type thermoelectric conversion element 21 and the n-type thermoelectric conversion element 22. Herein, the thickness T1 of the p-type thermoelectric conversion element 21 (and the thickness of the n-type thermoelectric conversion element 22) is 3 μm or more and 30 μm or less. Since the thickness T1 is within the above ranges, it is possible to suppress an increase in the number of elements per unit area and an internal resistance of the element. In addition, each of the p-type thermoelectric conversion element 21 and the n-type thermoelectric conversion element 22 included in the thermoelectric conversion part 11 includes the carbon nanotube and the conductive resin, and in each of the plurality of thermoelectric conversion parts 11, the mass percentage of the carbon nanotubes in the total mass of the thermoelectric conversion part 11 is, for example, 30% or more and 70% or less. This makes it easy to widen the temperature difference in the thermoelectric conversion part 11 while ensuring the electrical conductivity of each thermoelectric conversion part 11. Therefore, by adopting the thermoelectric conversion module 1 according to the present embodiment, it is possible to realize an output improvement per unit area.

In the present embodiment, the mass percentage of the carbon nanotubes in the total mass of the thermoelectric conversion part 11 may be 40% or more and 60% or less. In this case, it is easy to further widen the temperature difference in each thermoelectric conversion part 11.

In the present embodiment, the mass percentage of the carbon nanotubes in the total mass of the p-type thermoelectric conversion element 21 may be 30% or more and 70% or less, the mass percentage of the carbon nanotubes in the total mass of the n-type thermoelectric conversion element 22 may be 30% or more and 70% or less. In this case, since it is easy to widen the temperature difference in each p-type thermoelectric conversion element 21 and n-type thermoelectric conversion element 22, it is possible to realize further output improvement per unit area.

In the present embodiment, the interval S between the first thermal conduction part 5*a* and the second thermal conduction part 5*b* in the first direction D2 may be 3 mm or more and 15 mm or less. In this case, it is possible to realize further increase of the temperature difference in each thermoelectric conversion part 11 by the first thermal conduction part 5*a* and the second thermal conduction part 5*b*.

In the present embodiment, the thickness T1 of the p-type thermoelectric conversion element 21 may be 5 μm or more and 25 μm or less. The interval S may be 3 mm or more and less than 12 mm. In these cases, it is possible to further improve output per unit area of the thermoelectric conversion module 1.

In the present embodiment, the width L2 of each thermal conduction part 5 along the first direction D2 may be 0.5 mm or more and 2.0 mm or less. In this case, the heat transfer performance by each thermal conduction part 5 is favorably exhibited, and the internal temperature difference of the thermoelectric conversion part 11 can be increased.

In the present embodiment, each of the substrate 2, the thermoelectric conversion part 11 and the thermal conduction part 5 may have a flexibility. In this case, for example, the thermoelectric conversion module 1 can be easily provided along the surface of the cylindrical pipe. That is, it is possible to relax the restriction on the mounting place of the thermoelectric conversion module 1.

In the present embodiment, the dopant solution 51 is dropped onto the part 42*a* of the p-type thermoelectric conversion layer 42 to make the part 42*a* become the n-type thermoelectric conversion element 22. In this case, the contact resistance between the p-type thermoelectric conversion element 21 and the n-type thermoelectric conversion element 22 can be favorably reduced. Dropping of the dopant solution 51 is performed after formation of the thermal conduction part 5. Thus, the material contained in the dopant solution 51 is less likely to be deteriorated by heating or the like.

The thermoelectric conversion module and the manufacturing method thereof according to the present disclosure are not limited to the above-described embodiment, and various other modifications are possible. For example, although the thermoelectric conversion element is exposed on the first main face in the above-described embodiment, the present disclosure is not limited thereto. For example, the thermoelectric conversion element may be covered with a resinous sealing layer or the like. In addition, an insulator may be provided between two adjacent thermoelectric conversion groups. In this case, from the viewpoint of maintaining the internal temperature difference of the thermoelectric conversion part, the thermal conductivity of the insulator may be low.

In the above-described embodiment, a space is present between two adjacent thermal conduction parts, but the present disclosure is not limited thereto. For example, an insulator may be provided between two adjacent thermal conduction parts. In this case, from the viewpoint of maintaining the internal temperature difference of the thermoelectric conversion part, the thermal conductivity of the insulator may be low.

EXAMPLES

One aspect of the present disclosure will be described in more detail with the following examples, but one aspect of the present disclosure is not limited to these examples.

Example 1

<Dispersion Liquid>

80 g of the carbon nanotube dispersion liquid (concentration: 0.2% by mass, G/D ratio: 41, aqueous dispersion liquid, single-walled carbon nanotubes, diameters: 0.9 to 1.7 nm) was concentrated by evacuation until the carbon nanotube concentration became 0.4% by mass. Subsequently, 5.7 g of PEDOT/PSS aqueous dispersion liquid ("Clevious (registered trademark) PH1000" manufactured by Heraeus Holding, solid content concentration: 1.2% by mass) and the concentrated carbon nanotube dispersion liquid were sufficiently stirred with a three one motor ("PM203 type" manufactured by AS ONE CORPORATION) (stirring time: 30 minutes). Subsequently, the stirred liquid was sufficiently defoamed with a planetary centrifugal mixer ("THINKY MIXER ARE-310" manufactured by THINKY CORPORATION) (treatment time: 3 minutes). Thus, a dispersion liquid in which the content of the carbon nanotubes (CNTs) was 70% by mass with respect to the total amount of the PEDOT/PSS and the carbon nanotubes (CNTs) was prepared. The viscosity of the dispersion liquid at a shear rate of $0.01 s^{-1}$ was 1,070,000 mPa sec. The viscosity of the dispersion liquid was measured using a rheometer ("MCR302" (product name) manufactured by Anton Paar GmbH). The measurement conditions were as follows: 25° C. of temperature, φ 25 mm parallel plate of plate, 1 mm of gap.

<Dopant Solution>

0.32 g of potassium ferrocyanide trihydrate and 0.94 g of benzo-18-crown-6-ether were dissolved in 15 mL of ultrapure water to obtain a dopant solution. The concentrations of potassium ions and benzo-18-crown-6-ether in the dopant solution were 0.2 M, respectively. A molar ratio ($C_2/C_1$) was 1.

<Substrate>

A double-sided tape (manufactured by NICHIBAN Co., Ltd., NICETACK Lower Adhesion type) was attached to four sides of a 100 mm square glass plate. Further, a spray adhesive (manufactured by 3M Japan Limited, Regular Series S/N 55) was applied to the glass plate. In addition, a 100 mm square polyimide film (manufactured by DU PONT-TORAY Co., Ltd., Kapton H type, film thickness of 25 μm, and thermal conductivity of 0.16 W/mK) was prepared as a substrate material. Subsequently, the protective sheet of the double-sided tape attached to the glass plate was peeled off, and then the polyimide film was attached to the glass plate. Subsequently, the polyimide film was washed with acetone. Subsequently, a masking tape (manufactured by AIZU PROJECT Co., Ltd., Micron Masking Tape with width of 1 mm) was attached to a predetermined position on the polyimide film. In addition, a polyimide tape was attached to edge parts of the polyimide film and the glass plate. Thus, a laminated body of the polyimide film and the glass plate, which functioning as a substrate, was formed.

<Thermoelectric Conversion Module>

The dispersion liquid was dropped onto the polyimide film, and the polyimide film was coated with the dispersion liquid using a doctor-blade having a gap of 2.8 mm. Subsequently, the laminated body coated with the dispersion liquid was housed in a blowing and drying oven set at 60° C. for 3 hours. In this manner, a composite film having a thickness of 62 μm was formed on the polyimide film. The composite film is provided in both of a thermoelectric conversion region where thermoelectric conversion elements are to be provided on the polyimide film later and a conductive region where conductive parts are to be provided on the polyimide film later. Then, the masking tape was removed. As a result, the composite film was patterned. In the thermoelectric conversion region, the composite film is patterned in a stripe shape.

The thickness of the composite film was measured using a high-accuracy digital micrometer (manufactured by Mitutoyo Corporation, MDH-25 MB). Specifically, the thickness of the part where the composite film was provided and the thickness of the part where the composite film was not provided (the part where only the polyimide film was provided) were measured, and the difference between the two was taken as the thickness of the composite film.

Next, the entire laminated body was immersed in DMSO (manufactured by FUJIFILM Wako Pure Chemical Corporation) at room temperature for 30 minutes. Subsequently, the laminate body pulled up from the DMSO was placed on a hot plate set at 60° C. for 120 minutes. Thereafter, the polyimide film was separated from the glass plate by removing the polyimide tape at the edge. Thus, a p-type thermoelectric conversion layer was formed on a first main face of the polyimide film. In Example 1, the thickness of the p-type thermoelectric conversion layer was 10.5 μm.

Next, the polyimide film was fixed on the glass plate in a state where the p-type thermoelectric conversion layer faced the glass plate. Subsequently, a second main face of the polyimide film was coated with a high thermal conduction material (manufactured by Shin-Etsu Chemical Co., Ltd., G-789, silicone resin) using a dispenser "AD3000C" and a desktop robot "EzROBO-5GX" manufactured by Iwashita Engineering, Inc. At this time, an interval of the nozzle position from which the high thermal conduction material was discharged was set to 11 mm, and the coating was performed by moving the nozzle along the second direction. As a result, a plurality of high thermal conduction materials having strip shapes were coated on the second main face. After coating, the substrate was placed on a hotplate set at 120° C. for 60 minutes. Thus, a plurality of thermal conduction parts (thermal conductivity: 3.0 W/mK) were formed. The length T2 of the thermal conduction part is 1 mm, and the width L2 of the thermal conduction part is 1 mm, and the interval S between the thermal conduction parts in the second direction orthogonal to the first direction is 10 mm. The direction in which each thermal conduction part extends is orthogonal to the direction in which the p-type thermoelectric conversion layer provided in the thermoelectric conversion region extends.

Next, the polyimide film was fixed on the glass plate in a state where the thermal conduction part faced the glass plate. Subsequently, the glass plate was placed on a hot plate set at 60° C. Subsequently, the dopant solution was dropped onto a part of the p-type thermoelectric conversion layer functioning as a thermoelectric conversion element. In Example 1, first, the dopant solution was dropped onto the area with the width of 10 mm and the length of 5.5 mm. Subsequently, the dopant solution was dropped onto the area with the width of 10 mm and the length of 5.5 mm in the same way after leaving a space with the length of 5.5 mm. By repeating this dropping operation, the region to which the dopant solution was dropped and the region to which the dopant solution was not dropped were alternately arranged. As described above, 48 p-type thermoelectric conversion elements and 48 n-type thermoelectric conversion elements were formed on the polyimide film. That is, a total of 96 thermoelectric conversion elements were formed on the polyimide film. Accordingly, a total of 48 thermoelectric conversion parts including one p-type thermoelectric conversion element and one n-type thermoelectric conversion element are formed. Herein, the thickness of the n-type thermoelectric conversion element was substantially identical to the thickness of the p-type thermoelectric conversion element. End parts of each thermoelectric conversion part overlap the thermal conduction part, and at least a center of each thermoelectric conversion part does not overlap the thermal conduction part. The area occupied by the thermoelectric conversion elements on the polyimide film was 52.8 $cm^2$. The area occupied by two conductive regions R2 on the polyimide film was 17.4 $cm^2$. The content of the iron atom in the n-type thermoelectric conversion element was 0.01% by mass or more and 10% by mass or less.

Next, above-described thermoelectric conversion elements on the polyimide film was left on a hotplate to dry for 30 minutes. Subsequently, the polyimide film was housed in a blowing and drying oven set at 100° C. for 60 minutes. Through above processes, a thermoelectric conversion module in which the p-type thermoelectric conversion element and the n-type thermoelectric conversion element were alternately arranged in series connection was manufactured. The thermal conductivity of the p-type thermoelectric conversion element in the in-plane direction of Example 1 is a standard value when the thermal conductivity of the p-type thermoelectric conversion element in the in-plane direction of Comparative Example 1 to be described later is 100, and is shown in Table 1 below. Similarly, the thermal conductivity of the n-type thermoelectric conversion element in the in-plane direction of Example 1 is a standard value when the thermal conductivity of the n-type thermoelectric conversion element in the in-plane direction of Comparative Example 1 to be described later is 100, and is shown in Table 1 below.

The thermal conductivity of the thermoelectric conversion elements is expressed by (density)×(specific heat)×(thermal diffusivity). The density of the thermoelectric conversion element was calculated from the shape and mass of the thermoelectric conversion element. The specific heat of the thermoelectric conversion element was calculated using a literature value of the specific heat of PEDOT/PSS and a literature value of the specific heat of graphite as the specific heat of the carbon nanotube. At this time, the specific heat of the thermoelectric conversion element was calculated on the assumption that additivity holds with respect to the mixing ratio of PEDOT/PSS and the carbon nanotube. The thermal diffusivity of the thermoelectric conversion element was measured in the in-plane direction of the thermoelectric conversion element by an optical alternating current method using a thermal diffusivity measuring device (manufactured by ULVAC-RIKO, Inc., product name: LaserPIT). Details of the method for measuring the thermal diffusivity are as follows. First, AC heat of a certain frequency is applied to the sample surface by light irradiation. A periodic temperature change occurs in the sample, and a temperature wave is formed. The heating position in that time, the AC temperature amplitude and phase at a position different from the heating position are measured. From the measured AC temperature amplitude and phase, the thermal diffusivity is calculated according to the principle of the measurement method.

Example 2

A thermoelectric conversion module was formed in the same manner as in Example 1, except that a dispersion liquid in which the content of the carbon nanotubes was 60% by mass with respect to the total amount of the PEDOT/PSS and the carbon nanotubes was used. Each parameter in Example 2 is shown in Table 1 below.

Example 3

A thermoelectric conversion module was formed in the same manner as in Example 1, except that a dispersion liquid in which the content of the carbon nanotubes was 50% by mass with respect to the total amount of the PEDOT/PSS and the carbon nanotubes was used. Each parameter in Example 3 is shown in Table 1 below.

Example 4

A thermoelectric conversion module was formed in the same manner as in Example 1, except that a dispersion liquid in which the content of the carbon nanotubes was 40% by mass with respect to the total amount of the PEDOT/PSS and the carbon nanotubes was used. Each parameter in Example 4 is shown in Table 1 below.

Example 5

A thermoelectric conversion module was formed in the same manner as in Example 1, except that a dispersion liquid in which the content of the carbon nanotubes was 30% by mass with respect to the total amount of the PEDOT/PSS and the carbon nanotubes was used. Each parameter in Example 5 is shown in Table 1 below.

Comparative Example 1

A thermoelectric conversion module was formed in the same manner as in Example 1, except that a dispersion liquid in which the content of the carbon nanotubes was 75% by mass with respect to the total amount of the PEDOT/PSS and the carbon nanotubes was used. Each parameter in Comparative Example 1 is shown in Table 1 below.

Comparative Example 2

A thermoelectric conversion module was formed in the same manner as in Example 1, except that a dispersion liquid in which the content of the carbon nanotubes was 25% by mass with respect to the total amount of the PEDOT/PSS and the carbon nanotubes was used. Each parameter in Comparative Example 2 is shown in Table 1 below.

Reference Example 1

A thermoelectric conversion module was formed in the same manner as in Comparative Example 1, except that the interval of the thermal conduction parts was changed to 6.0 mm and the width and the length of the dropping area of the dopant solution were changed to width of 10 mm and the length of 3.5 mm (that is, the lengths of the p-type thermoelectric conversion element and the n-type thermoelectric conversion element were set to 3.5 mm). Each parameter in Reference Example 1 is shown in Table 2 below.

Reference Example 2

A thermoelectric conversion module was formed in the same manner as in Reference Example 1, except that the gap of the doctor-blade was changed to 4.0 mm. Each parameter in Reference Example 2 is shown in Table 2 below.

Reference Example 3

A thermoelectric conversion module was formed in the same manner as in Reference Example 1, except that the gap of the doctor-blade was changed to 2.0 mm. Each parameter in Reference Example 3 is shown in Table 2 below.

Reference Example 4

A thermoelectric conversion module was formed in the same manner as in Reference Example 1, except that the gap of the doctor-blade was changed to 1.1 mm. Each parameter in Reference Example 4 is shown in Table 2 below.

Reference Example 5

A thermoelectric conversion module was formed in the same manner as in Reference Example 1, except that the interval of the nozzle position was changed to 5 mm, the width and the length of the dropping area of the dopant solution were changed to width of 10 mm and the length of 2.5 mm (that is, the lengths of the p-type thermoelectric conversion element and the n-type thermoelectric conversion element were set to 2.5 mm) and the number of thermoelectric conversion element on the polyimide film was changed to 224. Each parameter in Reference Example 5 is shown in Table 2 below.

Reference Example 6

A thermoelectric conversion module was formed in the same manner as in Reference Example 1, except that the interval of the nozzle position was changed to 11 mm, the width and the length of the dropping area of the dopant solution were changed to width of 10 mm and the length of 5.5 mm (that is, the lengths of the p-type thermoelectric conversion element and the n-type thermoelectric conversion element were set to 5.5 mm) and the number of thermoelectric conversion element on the polyimide film was changed to 96. Each parameter in Reference Example 6 is shown in Table 2 below.

Reference Example 7

A thermoelectric conversion module was formed in the same manner as in Reference Example 1, except that the interval of the nozzle position was changed to 17 mm, the width and the length of the dropping area of the dopant solution were changed to width of 10 mm and the length of 8.5 mm (that is, the lengths of the p-type thermoelectric conversion element and the n-type thermoelectric conversion element were set to 8.5 mm) and the number of thermoelectric conversion element on the polyimide film was changed to 64. Each parameter in Reference Example 7 is shown in Table 2 below.

TABLE 1

| | unit | Example 1 | Example 2 | Example 3 | Example 4 | Example 5 | Comparative Example 1 | Comparative Example 2 |
|---|---|---|---|---|---|---|---|---|
| CNT | % by mass | 70 | 60 | 50 | 40 | 30 | 75 | 25 |
| interval S between the high thermal conduction parts | mm | 10 | 10 | 10 | 10 | 10 | 10 | 10 |
| film thickness T1 of thermoelectric conversion element after wash | μm | 10.5 | 11.25 | 11.14 | 11.02 | 10.82 | 11.34 | 10.04 |

TABLE 1-continued

| | unit | Example 1 | Example 2 | Example 3 | Example 4 | Example 5 | Comparative Example 1 | Comparative Example 2 |
|---|---|---|---|---|---|---|---|---|
| length L1 of the element | mm | 5.5 | 5.5 | 5.5 | 5.5 | 5.5 | 5.5 | 5.5 |
| number of the element | — | 96 | 96 | 96 | 96 | 96 | 96 | 96 |
| area of the elements | $cm^2$ | 52.8 | 52.8 | 52.8 | 52.8 | 52.8 | 52.8 | 52.8 |
| thermal conductivity (p-type) (standard value) | — | 88 | 75 | 73 | 71 | 70 | 100 | 61 |
| thermal conductivity (n-type) (standard value) | — | 86 | 78 | 70 | 70 | 69 | 100 | 66 |

TABLE 2

| | Reference Example 1 | Reference Example 2 | Reference Example 3 | Reference Example 4 | Reference Example 5 | Reference Example 6 | Reference Example 7 |
|---|---|---|---|---|---|---|---|
| The interval between thermal conduction parts(mm) | 6.0 | 6.0 | 6.0 | 6.0 | 4.0 | 10.0 | 16.0 |
| The thickness of thermoelectric conversion element (μm) | 14.7 | 21.2 | 10.5 | 5.8 | 15.2 | 14.9 | 14.8 |
| the length of the element (mm) | 3.5 | 3.5 | 3.5 | 3.5 | 2.5 | 5.5 | 8.5 |
| the number of the element | 160 | 160 | 160 | 160 | 272 | 96 | 64 |
| the area of the elements ($cm^2$) | 56 | 56 | 56 | 56 | 68 | 53 | 54 |

(Power Generation Evaluation of a Thermoelectric Conversion Module)

The thermal conduction parts of the thermoelectric conversion modules of Examples 1 to 5, Comparative Examples 1 and 2 and Reference Examples 1 to 7 were brought into contact with a hot plate at 100° C. Thus, a temperature difference was generated in each thermoelectric conversion part. In each thermoelectric conversion module, resistance value, open-circuit voltage, short-circuit current, maximum output and maximum output density per unit area of the thermoelectric conversion element were evaluated using a source meter ("Keithley 2612B" manufactured by Tektronix Inc.). The temperature difference in the thermoelectric conversion part was measured by a thermography ("InfRec R550Pro" manufactured by Nippon Avionics Co., Ltd.). In the case where resistance value, open-circuit voltage, short-circuit current, maximum output and maximum output density per unit area of the thermoelectric conversion element are each set to 100 in the thermoelectric conversion module of Comparative Example 1, the evaluating results of Examples 1 to 5 and Comparative Examples 1 and 2 are shown in Table 3 below. In addition, in the case where resistance value, open-circuit voltage, short-circuit current, maximum output and maximum output density per unit area of thermoelectric conversion element are each set to 100 in the thermoelectric conversion module of Reference Example 7, the evaluating results of Reference Examples 1 to 6 are shown in Table 4 below.

Figure 6:
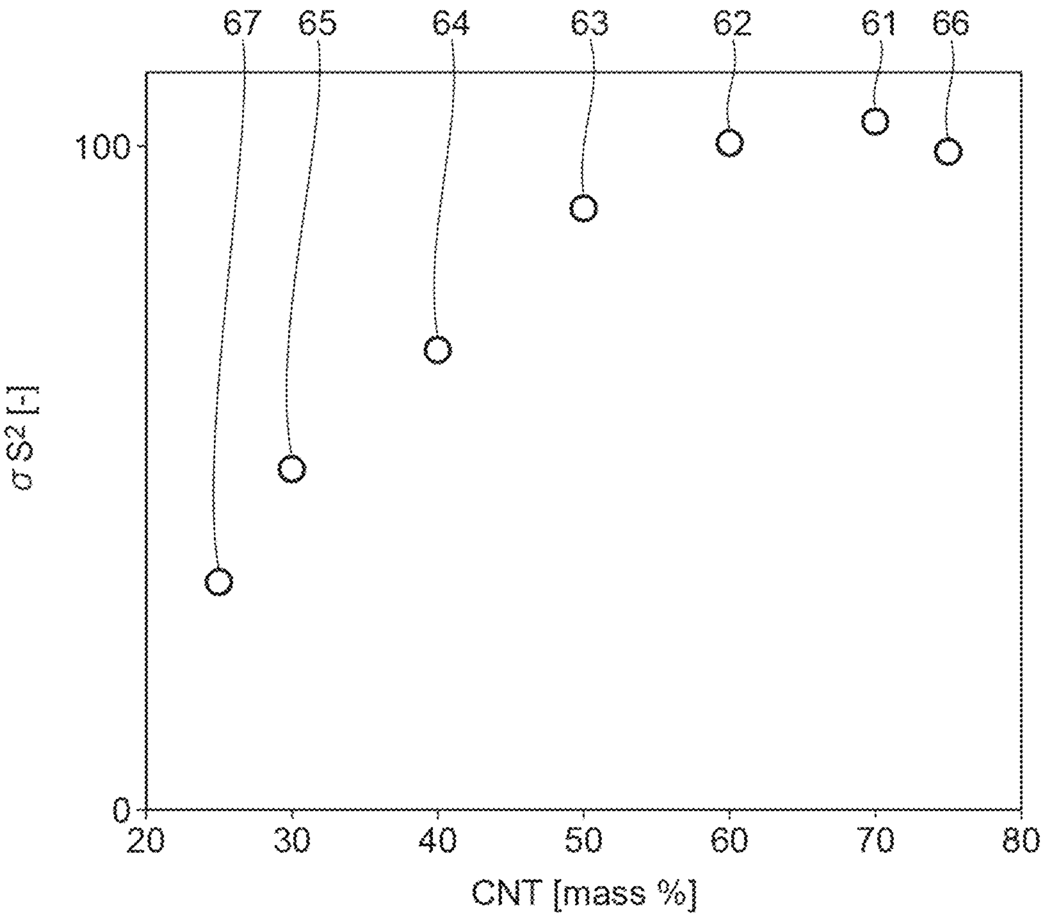
FIG. 6 is a graph showing the power factors of the thermoelectric conversion parts of Examples 1 to 5 and Comparative Examples 1 and 2.

FIG. 6 is a graph showing the power factors of the thermoelectric conversion parts of Examples 1 to 5 and Comparative Examples 1 and 2.

In FIG. 6, the horizontal axis represents the mass percentage of the carbon nanotubes, and the vertical axis represents the power factor. Here, the power factor is one of indexes for evaluating performances of the thermoelectric conversion part, and corresponds to $\sigma S^2$. $\sigma$ is the electrical conductivity of the thermoelectric conversion part, and S is the Seebeck coefficient of the thermoelectric conversion part. Further, in FIG. 6, plots 61 to 65 represent Examples 1 to 5, respectively, and plots 66,67 represent Comparative Examples 1 and 2, respectively. From FIG. 6, the values of $\sigma S^2$ of Examples 1 and 2 and Comparative Example 1 are almost the same. On the other hand, $\sigma S^2$ of Examples 3 to 5 was clearly lower than $\sigma S^2$ of Comparative Example 1. When the power factor of the thermoelectric conversion part of Comparative Example 1 is set to 100, the power factors of Examples 1 to 5 and Comparative Examples 1 and 2 are shown in Table 3 below.

Figure 7:
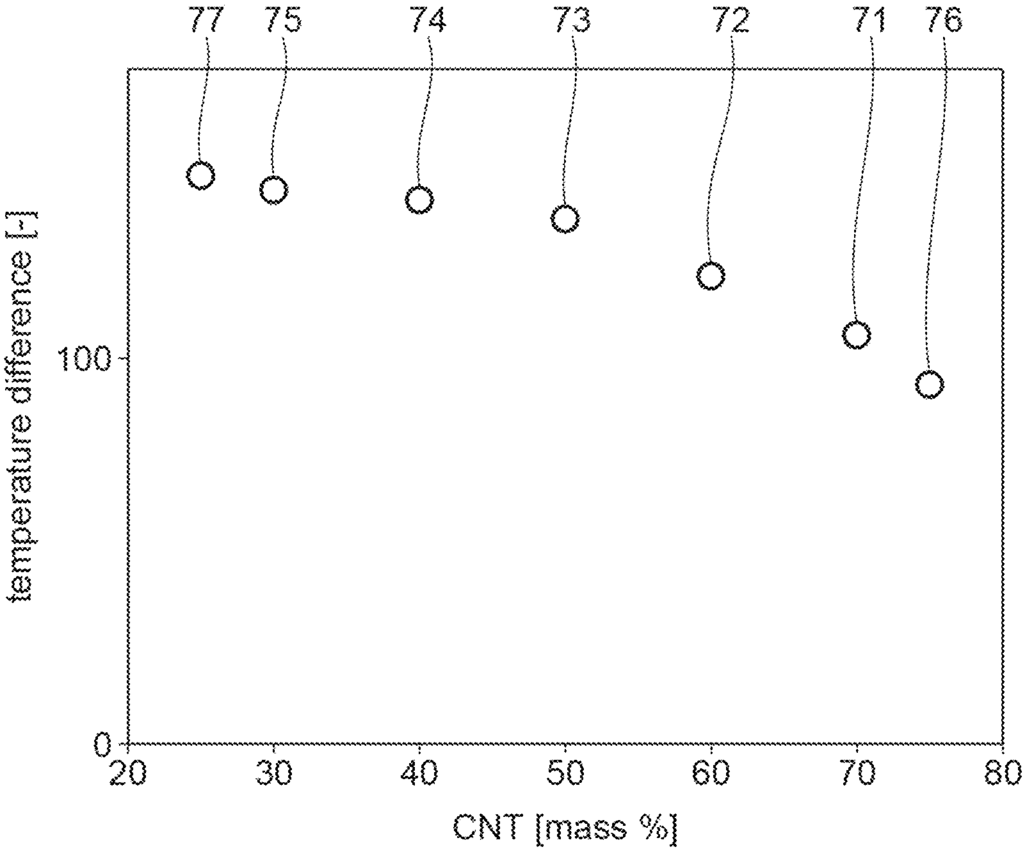
FIG. 7 is a graph showing the temperature differences of the thermoelectric conversion parts of Examples 1 to 5 and Comparative Examples 1 and 2.

FIG. 7 is a graph showing the temperature differences of the thermoelectric conversion parts of Examples 1 to 5 and Comparative Examples 1 and 2. In FIG. 7, the horizontal axis represents the mass percentage of the carbon nanotubes, and the vertical axis represents the temperature difference. In FIG. 7, plots 71 to 75 indicate the temperature differences of Examples 1 to 5, respectively, and plots 76, 77 indicate the temperature differences of Comparative Examples 1 and 2, respectively. It can be seen from FIG. 7 that the temperature difference tends to increase as the mass percentage of the carbon nanotubes decreases. When the temperature difference of the thermoelectric conversion part of Comparative Example 1 is set to 100, the temperature differences of Examples 1 to 5 and Comparative Examples 1 and 2 are shown in Table 3 below.

TABLE 3

| | Example 1 | Example 2 | Example 3 | Example 4 | Example 5 | Comparative Example 1 | Comparative Example 2 |
|---|---|---|---|---|---|---|---|
| resistance value (normalization value) | 107 | 99 | 102 | 125 | 167 | 100 | 213 |
| open-circuit voltage (normalization value) | 116 | 130 | 140 | 140 | 140 | 100 | 128 |
| short-circuit current (normalization value) | 108 | 131 | 137 | 111 | 84 | 100 | 60 |
| power factor (normalization value) | 105 | 101 | 91 | 70 | 52 | 100 | 35 |
| temperature difference (normalization value) | 114 | 130 | 146 | 151 | 154 | 100 | 158 |
| maximum output (normalization value) | 125 | 170 | 192 | 156 | 117 | 100 | 77 |
| maximum output density (normalization value) | 125 | 170 | 192 | 156 | 117 | 100 | 77 |

TABLE 4

| | Reference Example 1 | Reference Example 2 | Reference Example 3 | Reference Example 4 | Reference Example 5 | Reference Example 6 | Reference Example 7 |
|---|---|---|---|---|---|---|---|
| resistance value (normalization value) | 101 | 74 | 141 | 255 | 97 | 99 | 100 |
| open-circuit voltage (normalization value) | 167 | 238 | 213 | 267 | 146 | 142 | 100 |
| short-circuit current (normalization value) | 166 | 320 | 151 | 105 | 150 | 143 | 100 |
| maximum output (normalization value) | 291 | 191 | 320 | 279 | 322 | 202 | 100 |
| maximum output density (normalization value) | 283 | 186 | 311 | 271 | 258 | 208 | 100 |

Figure 8:
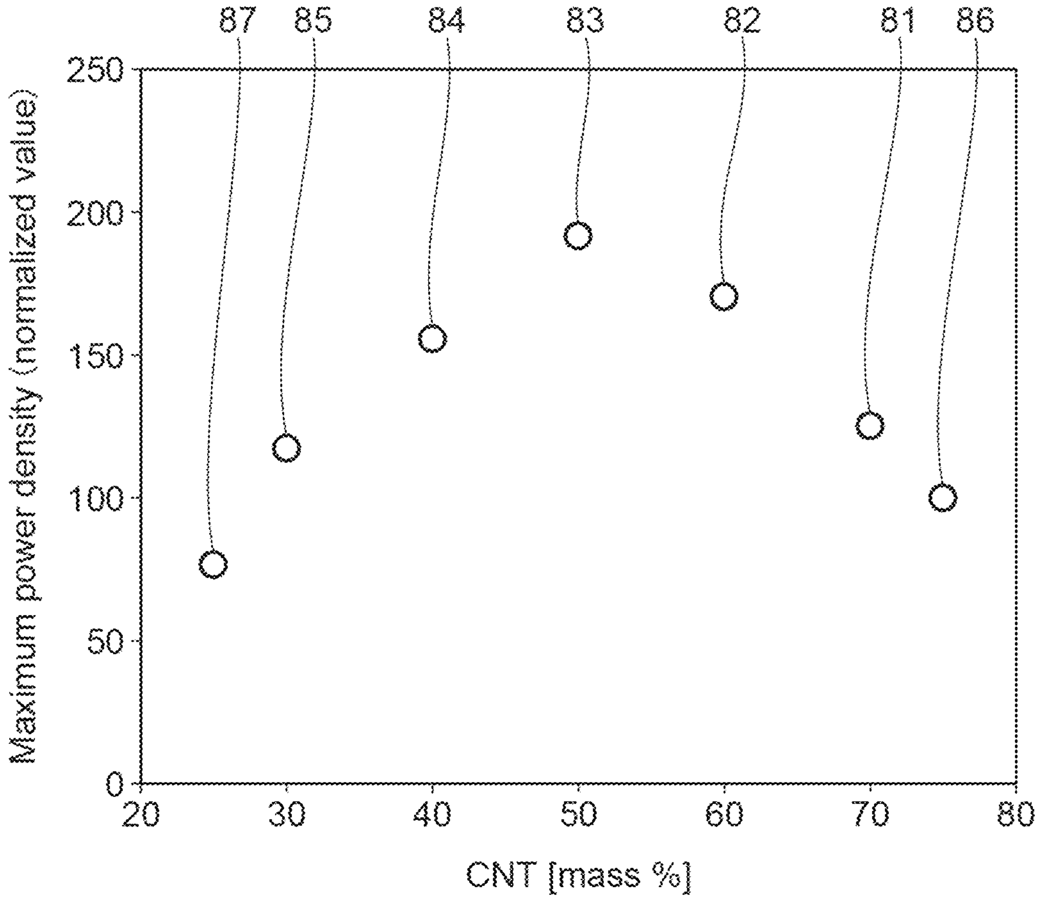
FIG. 8 is a graph showing the maximum output densities of the thermoelectric conversion modules of Examples 1 to 5 and Comparative Examples 1 and 2.

FIG. 8 is a graph showing the maximum output densities of the thermoelectric conversion modules of Examples 1 to 5 and Comparative Examples 1 and 2. In FIG. 8, the horizontal axis represents the mass percentage of the carbon nanotubes, and the vertical axis represents the maximum output density (normalization value). In FIG. 8, plots 81 to 85 indicate the maximum output densities of Examples 1 to 5, respectively, and plots 86, 87 indicate the maximum output densities of each of Comparative Examples 1 and 2, respectively. As shown in FIG. 8, the maximum output densities of Examples 1 to 5 all higher than that of Comparative Example 1. In particular, the maximum output densities of each of Examples 2 to 4 was 1.5 times or more that of Comparative Example 1. Further, the maximum output density of Comparative Example 2 was lower than that of Comparative Example 1.

In addition, as shown in Table 3, the resistance values of each of Examples 1 and 3 to 5 are all higher than that of Comparative Example 1. On the other hand, the open-circuit voltage and the maximum output of each of Examples 1 to 5 are all higher than that of Comparative Example 1. As described above, the maximum output densities of each of Examples 1 to 5 were all higher than that of Comparative Example 1. In particular, the maximum output densities of each of Examples 2 to 4 was 1.5 times or more that of Comparative Example 1. Further, the maximum output density of Comparative Example 2 was lower than that of Comparative Example 1. Thus, it can be seen that modules of Examples 1 to 5 (especially, Examples 2 to 4) are more practical than those of Comparative Examples 1 and 2 as a power source.

As shown in Table 4, the open-circuit voltages of each of Reference Examples 1 to 6 are all higher than that of Reference Example 7. Further, the short-circuit currents of each of Reference Examples 1 to 6 are all higher than that of Reference Example 7. The maximum output and the maximum output densities of each of Reference Examples 1 to 6 are all higher than that of Reference Example 7. From these results, it can be seen that the performance of the thermoelectric conversion module can be further improved by appropriately adjusting the interval between the thermal conduction parts, the thickness of the thermoelectric conversion element and the like.

REFERENCE SIGNS LIST

1; thermoelectric conversion module
2; substrate
2*a*; first main face
2*b*; second main face
3; thermoelectric conversion group
3*a*; first thermoelectric conversion group
3*b*; second thermoelectric conversion group
4; conductive part
5; thermal conduction part
5*a*; first thermal conduction part
5*b*; second thermal conduction part
11; thermoelectric conversion part
11*a*; first thermoelectric conversion part
11*b*; second thermoelectric conversion part
21; p-type thermoelectric conversion element
21*a*; first end part
21*b*; second end part
22; n-type thermoelectric conversion element
22*a*; first end part
22*b*; second end part D1; thickness direction
D2; first direction
D3; second direction
L1; length
L2; width
S; interval
R1; thermoelectric conversion region
R2; conductive region
T1; thickness
T2; length.

The invention claimed is:

1. A thermoelectric conversion module comprising:
a substrate having a first main face and a second main face located opposite the first main face;
a thermoelectric conversion part located on the first main face; and
a first thermal conduction part and a second thermal conduction part located on the second main face and adjacent to each other along a first direction orthogonal to a thickness direction of the substrate, wherein the thermoelectric conversion part comprises a p-type thermoelectric conversion element and an n-type thermoelectric conversion element arranged along the first direction,
wherein a first end part of the p-type thermoelectric conversion element in the first direction is in contact with a first end part of the n-type thermoelectric conversion element in the first direction,
wherein, in the thickness direction, the first thermal conduction part is overlapped with a second end part of the p-type thermoelectric conversion element in the first direction,
wherein, in the thickness direction, the second thermal conduction part is overlapped with a second end part of the n-type thermoelectric conversion element in the first direction,
wherein each thickness of the p-type thermoelectric conversion element and the n-type thermoelectric conversion element is 3 μm or more and 30 μm or less,
wherein an interval between the first thermal conduction part and the second thermal conduction part in the first direction is greater than a length of the p-type thermoelectric conversion element in the first direction and a length of the n-type thermoelectric conversion element in the first direction,
wherein each of the p-type thermoelectric conversion element and the n-type thermoelectric conversion element includes carbon nanotubes and a conductive resin, and
wherein a mass percentage of the carbon nanotubes in a total mass of the thermoelectric conversion part is 30% or more and 70% or less.

2. The thermoelectric conversion module according to claim 1,
wherein a mass percentage of the carbon nanotubes in the total mass of the thermoelectric conversion part is 40% or more and 60% or less.

3. The thermoelectric conversion module according to claim 1,
wherein a mass percentage of the carbon nanotubes in the total mass of the p-type thermoelectric conversion element is 30% or more and 70% or less, and
wherein a mass percentage of the carbon nanotubes in the total mass of the n-type thermoelectric conversion element is 30% or more and 70% or less.

4. The thermoelectric conversion module according to claim 1,
wherein the interval between the first thermal conduction part and the second thermal conduction part in the first direction is 3 mm or more and 15 mm or less.

5. The thermoelectric conversion module according to claim 1,
wherein each thickness of the p-type thermoelectric conversion element and the n-type thermoelectric conversion element is 5 μm or more and 25 μm or less, and
wherein the interval between the first thermal conduction part and the second thermal conduction part in the first direction is 3 mm or more and less than 12 mm.

6. The thermoelectric conversion module according to claim 1, further comprising:
a first thermoelectric conversion group located on the first main face, the first thermoelectric conversion group including the thermoelectric conversion part; and
a second thermoelectric conversion group located on the first main face and located adjacent to the first thermoelectric conversion group along a second direction orthogonal to the thickness direction and the first direction,
wherein the second thermoelectric conversion group includes a second thermoelectric conversion part located adjacent to the thermoelectric conversion part along the second direction,
wherein the second thermoelectric conversion part includes a second p-type thermoelectric conversion element and a second n-type thermoelectric conversion element arranged along the first direction,
wherein a first end part of the second p-type thermoelectric conversion element in the first direction is in contact with a first end part of the second n-type thermoelectric conversion element in the first direction,
wherein the first thermal conduction part and the second thermal conduction part each extend along the second direction,
wherein, in the thickness direction, the first thermal conduction part is overlapped with a second end part of the second n-type thermoelectric conversion element included in the second thermoelectric conversion part in the first direction, and
wherein, in the thickness direction, the second thermal conduction part is overlapped with a second end part of the second p-type thermoelectric conversion element included in the second thermoelectric conversion part in the first direction.

7. The thermoelectric conversion module according to claim 6, further comprising:
a first conductive part located on the first main face and connected to one end of the first thermoelectric conversion group in the first direction; and
a second conductive part located on the first main face and connected to the other end of the first thermoelectric conversion group in the first direction and to one end of the second thermoelectric conversion group in the first direction,
wherein each conductivity type of the first conductive part and the second conductive part is identical.

8. The thermoelectric conversion module according to claim 1,
wherein each width of the first thermal conduction part and the second thermal conduction part along the first direction is 0.5 mm or more and 2.0 mm or less.

9. The thermoelectric conversion module according to claim 1, wherein each of the substrate, the thermoelectric conversion part, the first thermal conduction part and the second thermal conduction part has a flexibility.

10. A method for manufacturing a thermoelectric conversion module according to claim 1, including:

forming a mask on the first main face of the substrate;

forming a first layer including a p-type thermoelectric conversion material on the first main face;

forming a p-type thermoelectric conversion layer by immersing the substrate in an organic solvent after removing the mask;

forming the first thermal conduction part and the second thermal conduction part on a second main face of the substrate after the forming the p-type thermoelectric conversion layer; and forming an n-type thermoelectric conversion element in a part of the p-type thermoelectric conversion layer by dripping a dopant solution on the part after the forming the first thermal conduction part and the second thermal conduction part.

* * * * *